United States Patent [19]

Hisamoto et al.

[11] Patent Number: 5,466,621
[45] Date of Patent: Nov. 14, 1995

[54] METHOD OF MANUFACTURING A SEMICONDUCTOR DEVICE HAVING SILICON ISLANDS

[75] Inventors: Dai Hisamoto, Kokubunji; Toru Kaga, Urawa; Shinichiro Kimura, Hachioji; Masahiro Moniwa, Hannou; Haruhiko Tanaka, Kokubunji; Atsushi Hiraiwa, Kodaira; Eiji Takeda, Koganei, all of Japan

[73] Assignee: Hitachi, Ltd., Tokyo, Japan

[21] Appl. No.: 141,027

[22] Filed: Oct. 25, 1993

Related U.S. Application Data

[62] Division of Ser. No. 845,063, Mar. 3, 1992, Pat. No. 5,346,834, which is a division of Ser. No. 742,196, Aug. 5, 1991, Pat. No. 5,115,289, which is a continuation of Ser. No. 438,016, Nov. 20, 1989, abandoned.

[30] Foreign Application Priority Data

Nov. 21, 1988 [JP] Japan .................................. 63-292499
Feb. 28, 1989 [JP] Japan .................................. 1-45403

[51] Int. Cl.$^6$ .............................. H01L 21/70; H01L 27/00
[52] U.S. Cl. ................................. 437/52; 437/29; 437/60; 437/919
[58] Field of Search .................................. 437/47, 52, 60, 437/919, 203, 29; 257/301, 302, 303, 306, 308, 135–136, 263, 331–334; 156/649

[56] References Cited

U.S. PATENT DOCUMENTS

| | | | |
|---|---|---|---|
| 4,546,534 | 10/1985 | Nicholas | 437/29 |
| 4,561,932 | 12/1985 | Gris et al. | 156/649 |
| 4,604,162 | 8/1986 | Sobczak | 156/649 |
| 4,670,768 | 6/1987 | Sunami et al. | 257/331 |
| 4,977,436 | 12/1990 | Tsuchiya et al. | 257/302 |
| 4,984,030 | 1/1991 | Sunami et al. | 257/332 |
| 5,106,775 | 4/1992 | Kaga et al. | 437/52 |

*Primary Examiner*—Olik Chaudhuri
*Assistant Examiner*—H. Jey Tsai
*Attorney, Agent, or Firm*—Antonelli, Terry, Stout & Kraus

[57] ABSTRACT

A semiconductor device such as FET or charge coupled device, having a channel or a charge coupled portion provided in a thin semiconductor layer which is nearly perpendicular to the substrate and to which the necessary electrode such as the gate electrode and the necessary insulating layer are added can maintain the necessary amount of electric current by securing the height of the semiconductor layer and also can have its plane size reduced minutely. Further, the semiconductor memory device using the above semiconductor device is suitable to high integration and has excellent electric characteristics.

20 Claims, 26 Drawing Sheets

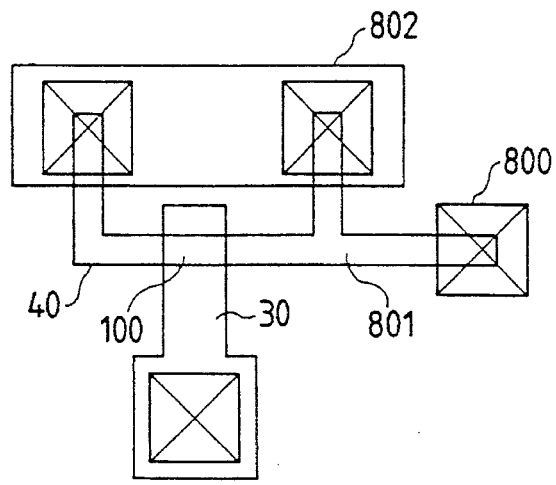
FIG. 21a
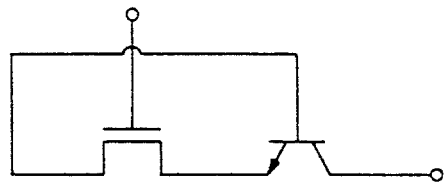
FIG. 21b
FIG. 22a
PRIOR ART
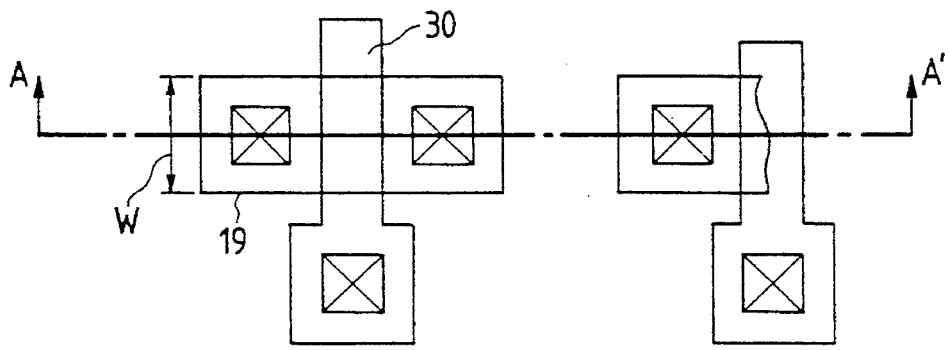
FIG. 22b
PRIOR ART
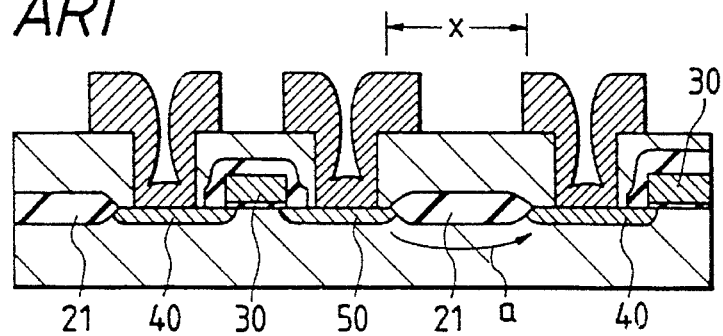

FIG. 23
PRIOR ART
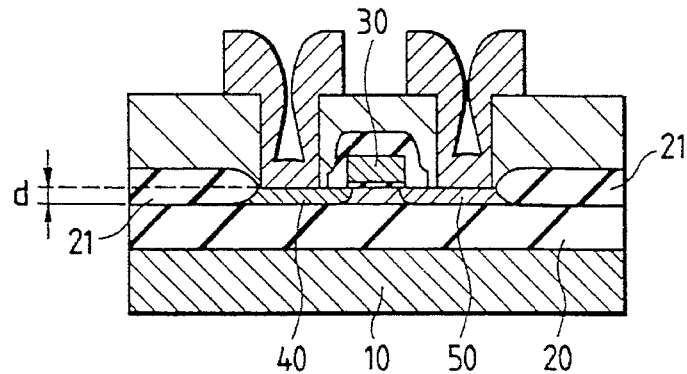
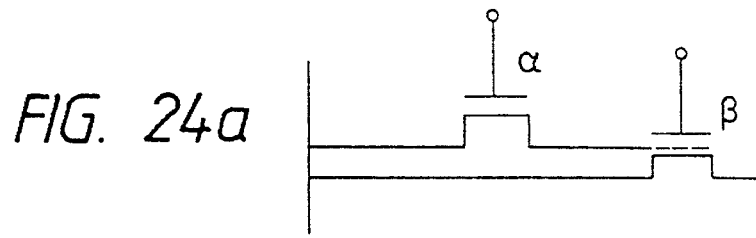
FIG. 24a
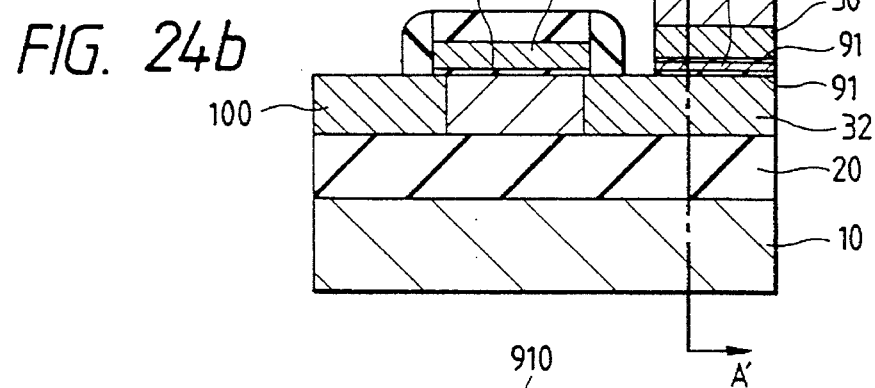
FIG. 24b
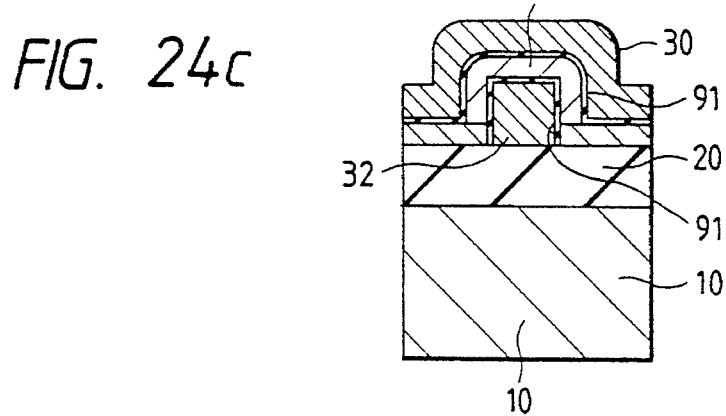
FIG. 24c

1

METHOD OF MANUFACTURING A SEMICONDUCTOR DEVICE HAVING SILICON ISLANDS

This is a divisional of application Ser. No. 845,063, filed Mar. 3, 1992 U.S. Pat. No. 5,346,834, which is a divisional of application Ser. No. 742,196 filed Aug. 5, 1991 U.S. Pat. No. 5,115,289, which is a continuation of application Ser. No. 438,016 filed Nov. 20, 1989, now abandoned.

BACKGROUND OF THE INVENTION

The present invention relates to a semiconductor device and semiconductor memory device having a insulated gate field effect transistor.

The conventional MOS field effect transistor (herein after abbreviated as "MOSFET") will be explained referring to the drawings. A typical construction is shown in FIG. 22a with a plan layout, and a sectional construction in FIG. 22b with A–A' section.

This element is made by separating the active region 19 through formation of thick insulating film around the active region 19, which is used as a channel and source/drain electrode, by forming the gate electrode 30 after the gate insulating film is formed on such active region 19, and by forming the source electrode 40 and drain electrode 50 by ion implantation method, using this gate electrode 30 as mask, in the course of self-alignment. When this device is integrated on the same substrate, the electrical separation will be made by separation of the active regions with the above insulating film 21 made of oxide film. In forming this oxide film, it is possible to have this portion covered by the oxide film to be kept in inactive condition, even if the operating voltage is applied to the gate, by maintaining adequate thickness of the oxide film when compared to the gate insulating film. In order to grow this oxide film, the oxidation is carried out normally in wet atmosphere, thereby growing the oxide film to an adequate film thickness. Such oxidation is called the field oxidation, and the grown oxide film the field oxide film. Hereinafter, the above terms will be used.

When the degree of integration is increased in the above element, for example, when the interval of the device shown with "x" in the drawing is shortened, there will arise problems, where it becomes easier for the electric current to flow underneath the field insulating film 21, shown by an arrow mark "a" in the drawing.

In order to eliminate such unnecessary electric current path, the SOI (Silicon On Insulator) substrate construction, where the insulating film 20 is laid underneath the channel, as shown in FIG. 23, had been considered.

With respect to the FET formed on this insulator, discussions were made in IEEE Electron Device Letters, vol. 9, No. 2, February (1988), pp. 97–99.

This construction forms the transistor on the substrate 10, which has therein the silicon oxide layer formed by ion implantation of oxygen, as the insulating layer 20. The transistor is made by such process that the gate insulating film is formed on the semiconductor of the surface of the above substrate and the gate electrode 30 is deposited, and thereafter the source electrode 40 and drain electrode 50 are formed in using ion implantation method to the gate portion, in the course of self-alignment . This transistor adopts the same construction as the construction of the normal MOSFET shown in FIG. 22a in a plan layout.

Further, as a feature of the construction which can be seen here, it can be mentioned that the silicon on the insulating film 20 has the thin film thickness d, namely the channel thickness, of at most approximately 0.1 μm. With the construction shown in FIG. 22a and FIG. 22b, it is difficult for the field effect to reach the substrate interior at a distance from the gate. Whereas, with the construction shown in FIG. 23, the region where it is difficult for the field effect to reach is replaced by an insulator, thereby permitting effective control of the device action by the gate.

In the construction according to the above conventional techniques, there is the following relationship between the electric current I sent through the device and the channel width W:

$$I \propto W$$

Therefore, there is a problem, where when W is reduced, I will also be reduced. Accordingly, it was not possible to reduce the plane dimensions without reducing the current.

This also constituted the restrictions, where plane dimensions could not be reduced in a semiconductor memory device formed by combining semiconductor devices according to the above conventional techniques (for example, SRAM) and in a semiconductor memory device formed by the combination of the semiconductor devices according to the above conventional techniques and the capacity elements, which are other semiconductor elements (for example, DRAM).

SUMMARY OF THE INVENTION

The object of the present invention is to provide a semiconductor device and a semiconductor memory device, which are suitable for high integration.

The above object can be accomplished by:

(1) In a semiconductor device, having a field effect transistor, which is provided with the source electrode and the drain electrode on a substrate, and, further, which is provided with the channel between the source electrode and the drain electrode and with the gate electrode which causes field effect on the channel via insulating film, a semiconductor device characterized by that the above channel, at least a part thereof, is provided in the semiconductor layer nearly perpendicular to the substrate and direction of the current flowing through the above channel is nearly parallel to the substrate, (2) A semiconductor device, stated in the above (1), characterized by that there is provided an insulating layer installed at least between a part of the bottom of the channel in the direction perpendicular to the substrate and the substrate, (3) A semiconductor device, stated in the above (1), characterized by having the above channel insulated substantially from the substrate, (4) In a semiconductor device, having on said substrate a charge coupled device which is provided with the charge coupled portion and a plurality of gate electrodes which act on the charge coupled portion via insulating film, a semiconductor device characterized by that at least a part of the above charge coupled portion is provided in the semiconductor layer nearly perpendicular to the substrate and a direction of the charge transfer in the above charge coupled portion is nearly parallel to the substrate, (5) In a semiconductor memory device, which has at least two transistors on a substrate, and in which at least one of the transistors is a field effect transistor having a source electrode, a drain electrode, a channel and a gate electrode which causes field effect to the channel via insulating film, a semiconductor memory device characterized by that at least a part of the channel of the above field effect transistor is provided between the above source electrode and the drain electrode nearly perpendicular to the substrate, and the direction of the current flowing through the above channel is nearly parallel to the substrate, (6) A semiconductor memory device, stated in the above (5), characterized by having the above channel insulated substantially from the substrate, (7) In a semiconductor device, having at least two field effect transistors, each of which is provided with the source electrode and the drain electrode on a substrate, and, further, which is provided with the channel between the source electrode and the drain electrode, and the gate electrode which causes field effect on the channel via insulating film, a semiconductor device characterized by that each of the above channels, at least a part thereof, is provided in the semiconductor layer nearly perpendicular to the substrate, and the direction of the current flowing through the above channel is nearly parallel to the substrate and at least one gate electrode of the above transistors is installed between the above two channels, (8) In a semiconductor memory device, having at least one field effect transistor, which is provided with a source electrode and a drain electrode on a substrate, a channel installed between the source electrode and the drain electrode, and the gate electrode which causes field effect on the channel via insulating film and also having at least one capacitor, a semiconductor memory device characterized by that the above channel, at least a part thereof, is provided in the semiconductor layer nearly perpendicular to the substrate, and the direction of the current flowing through the above channel is nearly parallel to the substrate, and (9) A semiconductor memory device, stated in the above (8), characterized by having the above channel insulated substantially from the substrate.

In the present invention, it is desirable that the channel is insulated substantially from the substrate. The word "substantially" here means that, even if not completely insulated, it will cause the same effect as in the case of insulation in operating voltage. Further, it is desirable that the semiconductor layer nearly perpendicular to the substrate is a thin film.

Thickness of the semiconductor layer nearly perpendicular to the above substrate is to be 0.2 μm or less, preferably to be 0.1 μm or less, or still preparably to be 0.05 μm or less. Further, the lower limit of this thickness is considered to be around the thickness of the gate insulating film, since the present semiconductor device is of a construction of the field effect transistor having the gate electrode via insulating film. At the present technical level, the thickness of the gate insulating film is considered to be 3 nm as a limit, in consideration of such problems as dielectric strength, etc. Therefore, the lower limit of the semiconductor layer thickness nearly perpendicular to the substrate at the present technical level is approximately 3 nm.

Height of the semiconductor layer nearly perpendicular to the substrate is desired to be as high as possible, because the current flowing through the channel increases with the height. However, its upper limit depends on the restriction in the manufacturing process. That is, in case the semiconductor layer perpendicular to the substrate is formed by etching of the substrate, for example, assuming that a $SiO_2$ film of 10 nm in thickness is masked, when the silicon substrate is dry-etched at selection ratio of 100, it is possible to make height of the formed semiconductor layer 1 μm. The lower limit in the height of this semiconductor layer does not exist specially, and some protrusion from the substrate surface will produce corresponding effects. For example, a protrusion of 0.2 μm in height will have sufficient characteristics.

Further, it is desirable that the above semiconductor layer stands vertically on the substrate surface. However, it is often the case where the semiconductor layer section cut by a plane perpendicular to the semiconductor layer and the substrate are in a trapezoidal form, whose width increases as it approaches closer to the substrate surface. In such cases, the angle formed between the substrate surface and the side of trapezoid intersecting thereto (namely, the angle between the substrate surface and the side surface of semiconductor) is desired to be 80° or more. When this angle is less than 80°, it is not desirable, since the effect of the present invention is reduced.

Further, the semiconductor layer nearly perpendicular to the substrate can be of the same material, impurity concentration and conductive type as the channel and its environs of the conventional field effect transistor.

In FET of the present invention, where the channel is provided in the semiconductor layer, which is nearly perpendicular to the substrate, and direction of the current flowing in the channel is made nearly parallel to the substrate, it is possible to increase the channel width, which determines the amount of current, by increasing the semiconductor layer height. For that reason, without damaging the thin film channel effect of obtaining good electric characteristics by the gate, it is possible to maintain the sufficient amount of current by securing the enough semiconductor layer height and also to produce FET with fine details in a plane surface.

Furthermore, in a semiconductor memory device which can be obtained by combining this FET with other elements, it is also possible to accomplish fine detailing of the whole device, since fine detailing of the FET is made.

In the above semiconductor device and semiconductor memory device of the present invention, knowledge and information of the conventional techniques in this field can be used, excepting that at least a part of the channel or charge coupled portion is provided in the semiconductor layer nearly perpendicular to the substrate and also that the necessary electrode among source, drain and gate electrodes and the necessary insulating layer are added to this semiconductor layer.

BRIEF DESCRIPTION OF THE DRAWINGS

FIGS. 3b and 3c are sectional views of the semiconductor device shown in FIG. 3a;

FIG. 4b is a sectional view of the semiconductor memory device shown in FIG. 4a;

FIG. 4c is a plan view showing a modified example of the semiconductor memory device shown in FIG. 4a;

FIG. 4e is a sectional view showing other modified example of the semiconductor memory device shown in FIG. 4a;

FIGS. 7b and 7c are sectional views of the semiconductor memory device shown in FIG. 7a;

FIGS. 9b and 9c are sectional views of the semiconductor memory device shown in FIG. 9a;

FIG. 11b and 11c are sectional views of the semiconductor memory device shown in FIG. 11a;

FIGS. 14b and 14c are sectional views of the semiconductor memory device shown in FIG. 14a;

FIG. 14d is a plan view showing a modified example of the semiconductor memory device shown in FIG. 14a;

FIG. 15b is a sectional view of the semiconductor memory device shown in FIG. 15a;

FIG. 16b is a sectional view of the semiconductor memory device shown in FIG. 16a;

FIG. 17b is a sectional view of the semiconductor device shown in FIG. 17a;

FIG. 17c is a sectional view showing a modified example of the semiconductor device shown in FIG. 17a;

FIG. 18b is a sectional view of the semiconductor device shown in FIG. 18a;

FIG. 19b is an equivalent circuit diagram of the semiconductor device shown in FIG. 19a;

FIGS. 20a and 20b are sectional views of the semiconductor device shown in FIG. 19a;

FIG. 21a is a plan layout diagram of the semiconductor device in an embodiment of the present invention;

FIG. 21b is an equivalent circuit diagram of the semiconductor device shown in FIG. 21a;

FIG. 22a is a plan layout diagram of the field-effect transistor in conventional technique;

FIG. 22b is a sectional view of the transistor shown in FIG. 22a;

FIG. 23 is a sectional view of the field-effect transistor in another conventional technique;

FIG. 24a is an equivalent circuit of the semiconductor memory device in an embodiment of the present invention;

FIGS. 24b and 24c are sectional views of the semiconductor memory device shown in FIG. 24a;

FIG. 25b is a plan layout diagram of the semiconductor memory device shown in FIG. 25a;

FIG. 25c is a sectional view of the semiconductor memory device shown in FIG. 25a.

DESCRIPTION OF THE PREFERRED EMBODIMENT

EMBODIMENT 1

Figure 1:
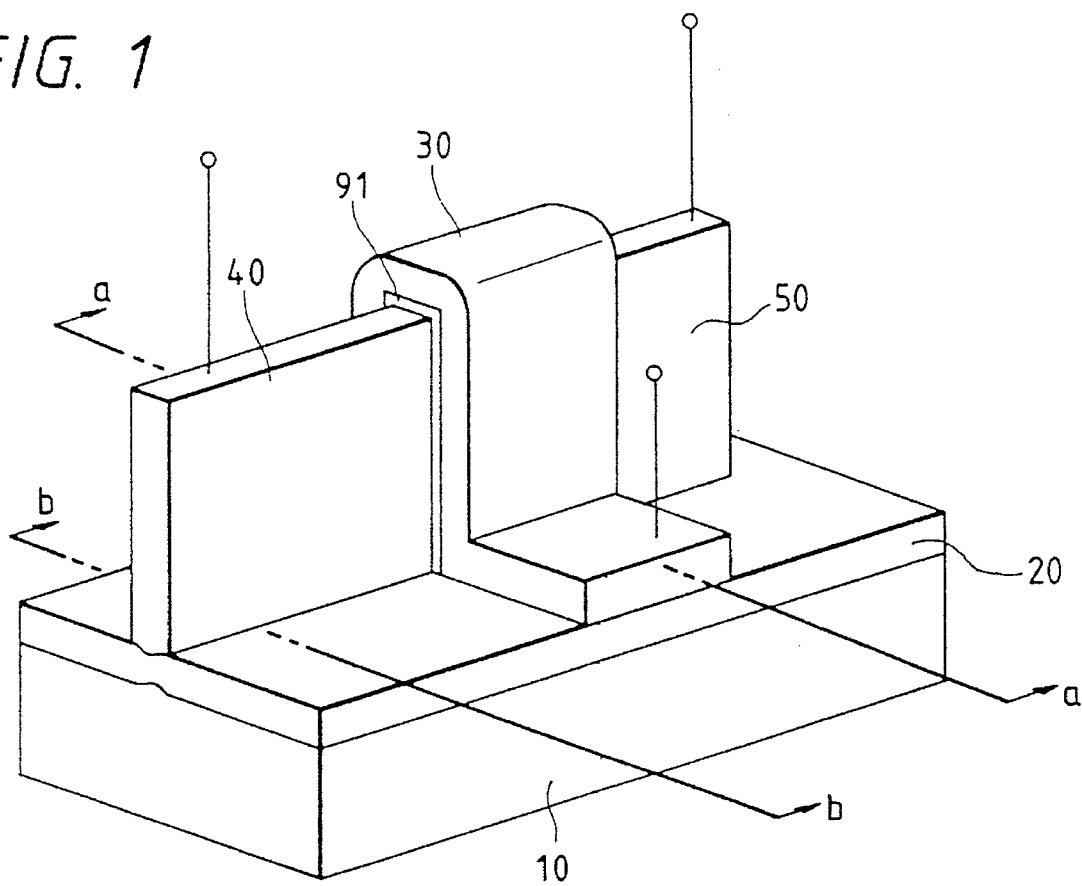
FIG. 1 is a perspective view showing the semiconductor device in an embodiment of the present Invention.

Hereinafter an embodiment of the present invention will be explained referring to the drawings. FIG. 1 is a structural diagram of the element, representing the characteristics of the present invention. The thin film semiconductor layer standing perpendicular to the substrate is separated from the substrate 10 by the insulating layer 20. The gate electrode 30 surrounds the thin film semiconductor layer by holding the gate insulating film 91 between them. The thin film portions not covered by the gate are the source electrode 40 and the drain electrode 50, which are activated by doping with high concentration of impurities, and the thin film semiconductor layer between the electrodes, covered by the gate, constitutes the channel in a direction parallel to the substrate surface. Since the channel is surrounded by insulating layer 20 and gate insulating film 91, it is electrically separated from the substrate 10.

The gate electrode 30 causes field effects on the channel via the gate insulating film 91, which consists of silicon oxide of 10 nm in thickness, thereby making three terminal field-effect type transistor action by source electrode 40 and drain electrode 50.

When Gm is made the mutual conductance, $C_G$ the gate capacity, and $C_D$ the load capacity, principally consisting of diffusion layer capacity, there is a relationship of $$f_o \propto \frac{G_m}{C_G + C_D}$$

between the maximum operating frequency $f_o$ in MOSFET and those values. In the semiconductor device of the present invention, since it is possible to increase $G_m$ by the field effect from the gate on both sides and to reduce $C_D$ extremely, it is possible to increase the maximum operating frequency $f_o$. For this reason, the semiconductor device of the present invention is suitable as an element used in communications requiring high-speed action or for construction of the logic circuit operated at a high clock period.

This construction can be made similarly in either P type channel transistor or N type channel transistor. Here, the forming method of N type channel transistor will be explained by using FIGS. 2a through 2g. FIGS. 2a, 2b, 2c and 2e show the a—a section of FIG. 1.

Figure 2A:
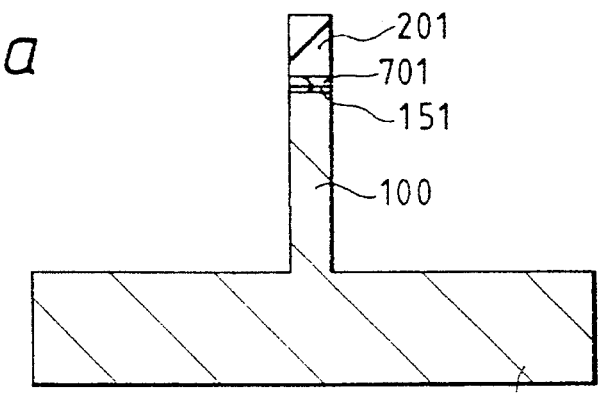
FIGS. 2a through 2g are sectional views showing the manufacturing process of the semiconductor device shown in FIG. 1 as well as the semiconductor device similar thereto.

The process shown in FIG. 2a; the silicon oxide film 151 of around 20 nm in thickness is formed by thermal oxidation of P type silicon substrate surface, and, after depositing the silicon nitride film 701 of around 20 nm in thickness by CVD (chemical vapor deposition) method, photoresist 201 is patterned into fine lines, thereby masking thereof, and further the substrate is vertically etched for around 1 μm by RIE (reactive ion etching) method, thereby forming a semiconductor layer 100 of 0.1 μm in thickness which stands perpendicular to the substrate. This patterning may be made employing the silicon oxide film, in place of the photoresist film. Hereinafter, the layer standing perpendicular to the substrate in the above manner, part of which is used as the channel, is to be called the semiconductor layer.

When the thickness of the semiconductor layer 100 at this time is made smaller than the width of the depletion layer which will extend due to field effect of the gate, it is possible to obtain thin film transistor action. That is to say, it is possible to produce depletion condition or inversion condition in the semiconductor layer, in a strong inversion condition of the channel surface, where the channel becomes "on" condition by applying bias on the gate. For this reason, it is possible to carry out the control by the gate, such as suppression of the hole density in semiconductor layer.

In general, the depletion layer width Xd, which the gate extends to the substrate side via the gate insulating film, namely the extent of having the field effect, can be assumed to be expressed by the following equation;

$$Xd = \sqrt{(2 \times Ks \times \epsilon o \times \phi s/q \times Ns)}$$

Where

Ks: Dielectric constant of the substrate semiconductor, $\epsilon o$: Dielectric constant of vacuum, $\phi s$: Potential change in depletion layer on the surface which turns to strong inversion condition, q: Charge of electron, and Ns: Concentration of impurities in substrate.

Therefore, in a silicon channel, when concentration of impurities in substrate is $5 \times 10^{16}$ cm$^{-3}$, for example, Xd becomes around 0.1 μm. In the present embodiment, as explained in subsequent process, the semiconductor layer 100 will have field effect by the gate electrode 30 from both sides. Therefore, film thickness of the semiconductor layer can be set at 0.2 μm or less, or more preferably 0.1 to 0.05 μm or less.

Figure 2B:
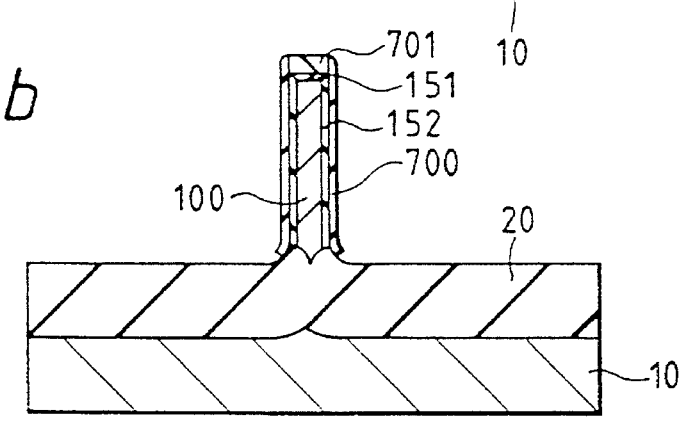

The process shown in FIG. 2b; the silicon nitride film 700 is formed on the side wall of the semiconductor layer 100 of thin film state, after forming the semiconductor layer 100 of the above thin film state, by removing the photoresist mask 201, forming silicon oxide film 152 of around 20 nm on the substrate surface, depositing silicon nitride film of around 20 nm using the CVD method, and etching the silicon nitride film anisotropically using the RIE method. It is possible to form thick field oxidation film selectively on the surface of the substrate 10, other than the semiconductor layer 100, by removing the silicon oxide film 152 in the portion not covered with silicon nitride films 701 and 700, in applying etching with mixture of various hydrofluoric acids on the above substrate and, further, in applying light etching on the silicon at the lower level of the semiconductor layer 100 by use of wet etching with HF/HNO$_3$ solution, and then by field oxidation in wet environment of 1100° C. This oxide film becomes the insulating layer 20. At this time, due to growth of the oxide film from both sides, the extending oxidized films will be connected together, thereby separating the semiconductor layer 100 from the substrate 10.

Figure 2C:
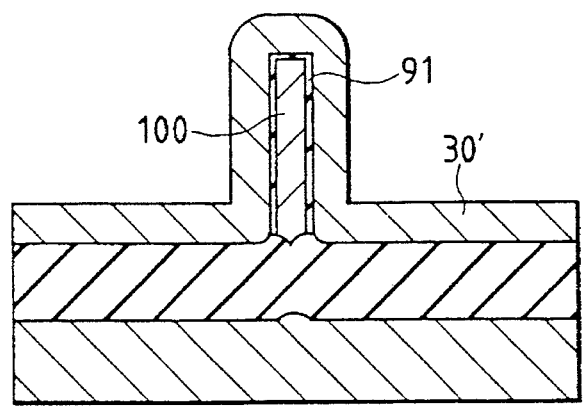

The process shown in FIG. 2c; by forming thermally oxidized film (not illustrated) in oxidizing thin film surface of the semiconductor layer 100, after removing the silicon nitride films 700 and 701 with wet etching, and also by removing this thermally oxidized film with isotropic etching in using mixture of hydrofluoric acids, the surface damaged due to etching is removed from the surface of the semiconductor layer 100, and the film thickness of the semiconductor layer 100 is prepared to the predetermined thickness. Thereafter, the gate oxide film 91 of 10 nm in thickness is formed by oxidation, around 200 nm of polycrystalline silicon 30', which becomes the gate, is deposited, photoresist material is patterned, and the gate is processed by etching using the above as mask. The oxide film thickness which grows in thermal oxidation process at the time of forming the gate oxide film 91 has the face orientation dependency. Therefore, the wafer face orientation and layout orientation are to be selected, so that (100) plane appears on the surface of the protruded side, which becomes the main channel and also that (111) plane, on which thick oxide film grows, is set to become the upper surface of wafer (namely, the surface which becomes the base when processing the polycrystalline silicon for the gate), thereby permitting control of the characteristics of the element to be obtained. Each of the source, drain and gate electrodes is formed by removing the gate oxide film on the semiconductor layer surface, other than the gate insulating film between the gate electrode and the semiconductor layer, with wet etching in using mixture of hydrofluoric acids, by introducing highly concentrated phosphorous into source electrode 40, diffusion layer of drain electrode 50 and polycrystalline silicon 30', which becomes the gate electrode, with doping of phosphorous, and by activating the impurities through heat annealing. This introduction of impurities into the source and drain electrodes may be carried out by ion implantation, using the gate as the mask. This can be formed by ion implantation to both sides of the semiconductor layer 100 in a diagonal direction with respect to the substrate. Further, when the height of the semiconductor layer 100 is low, for example, when it is around 0.2 μm, source and drain electrodes can be formed, without wide diffusion of impurities by heat treatment after the ion implantation; and it is possible to stop entry of impurities due to ion implantation by field oxidized film, since the ion implantation energy can be set at a low level; so that under such circumstances, ion implantation in nearly perpendicular direction to the substrate surface may be employed for forming the electrodes.

Figure 2D:
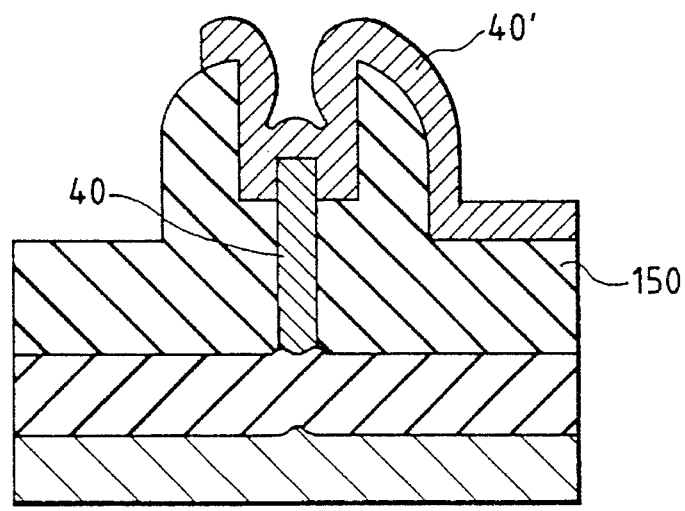

The process shown in FIG. 2d; this diagram shows the section b—b in FIG. 1. After the process in FIG. 2c, silicon oxide 150 is deposited on thermally oxidized film (not illustrated), which had been grown on the surface of gate electrode 30, source electrode 40 and drain electrode 50. Thereafter, contact holes are opened in gate electrode 30, source electrode 40 and drain electrode 50, and each wiring is made. In forming the contact, the contact surface can be increased, and the contact resistance can be reduced, by letting the contact face the side surfaces of the semiconductor layer 100. Numeral 40' designates the source wiring.

Figure 2E:
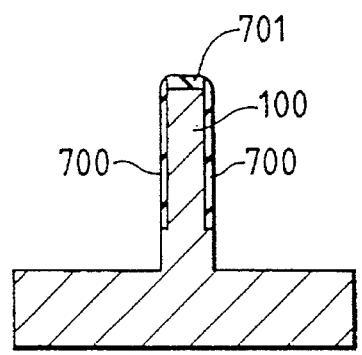
Figure 2F:
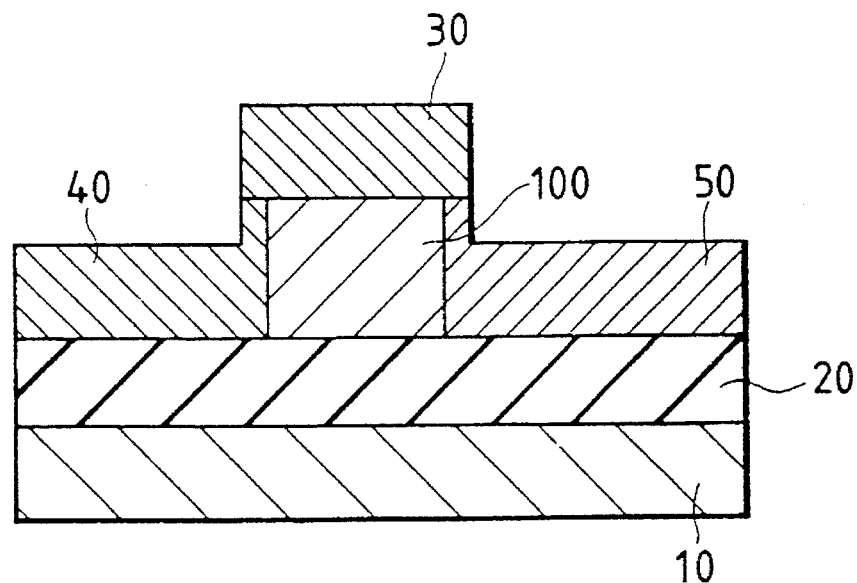

In the foregoing, manufacturing method of the element structure shown in FIG. 1 has been shown. An example of the improvement to the above method will be shown. In the process of FIG. 2b, it is possible to form a region having no silicon nitride film 700 on the lower side wall of the semiconductor layer 100, in forming the semiconductor layer by etching, after silicon nitride film 700 is formed only on the side wall, by adding the semiconductor substrate etching (FIG. 2e). When field oxidation is made thereafter, forming of the insulating layer 20 underneath the semiconductor layer 100 can be facilitated.

Further in the process of FIG. 2a, while oxidation of upper part of the semiconductor layer was suppressed by depositing silicon nitride film 701 beforehand on the upper part of the semiconductor layer, it is also possible to form an oxide film on the upper part of the semiconductor layer by field oxidation without depositing silicon nitride film on the upper part. In this case, the oxidized film will act as the stopper layer for etching in processing of the gate later.

Further, the semiconductor layer height determines the channel width. Therefore, by increasing the semiconductor layer height, it is possible to increase the current flowing therein. However, increasing this height will require the work of providing a contact to the source and drain to be carried out above the high semiconductor layer, in subsequent process, thereby making it difficult to form the outgoing layer for contact. Therefore, as shown in the transverse sectional view of another embodiment in FIG. 2f, it is possible to avoid the above difficulty by lowering the height of the semiconductor layer, other than the channel.

Figure 2G:
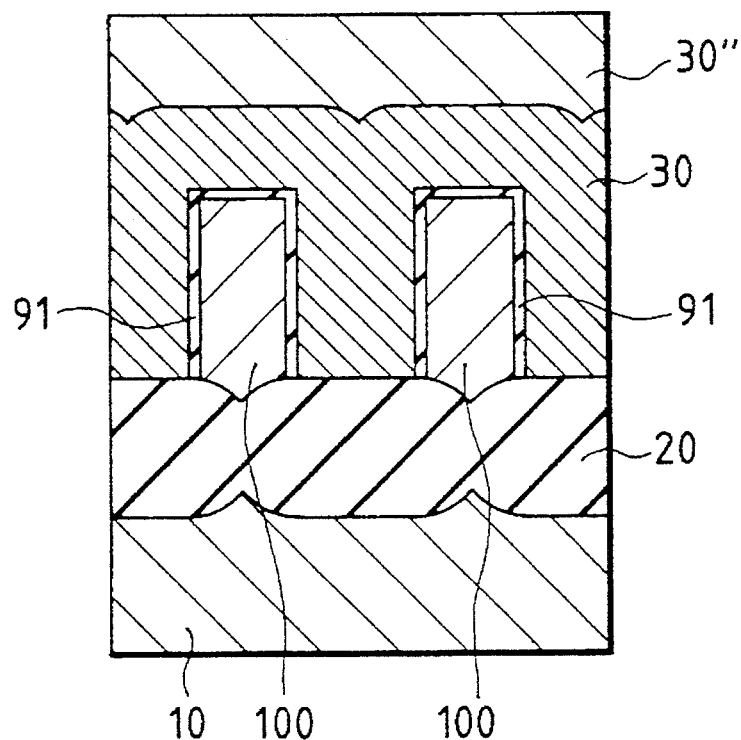

In the construction of the present invention, since the gate electrode strides across the semiconductor layer 100, which becomes the channel, the gate length becomes effectively larger, when compared to the conventional planar MOSFET. Therefore, there will arise a problem due to increase in the gate wiring resistance. However, as shown in FIG. 2g, when the deposition of polycrystalline silicon in gate electrode 30 is made into a thickness equivalent to ½ or more of the width between the adjoining channels, the upper part of the gate can be connected nearly uniform, thereby maintaining the gate resistance to the level of that in the conventional construction. Further, as shown in FIG. 2g, it is possible to reduce wiring resistance of the gate electrode by providing tungsten silicide layer 30" on this gate electrode or by replacing the gate electrode 30 with the silicide. With this construction the threshold voltage of gate bias, which determines on/off condition of the device, is highly dependent on the work function of the gate material. Therefore, by use of such materials as silicide, etc., having suitable work functions as the gate material, it is possible to set a threshold voltage necessary for circuit operation.

In the present embodiment, an example is shown in the case of nMOS, where n type highly concentrated impurity layer is made the source and drain electrodes, when the threshold voltage is set at a point where the source electrode and the gate electrode (formed by highly concentrated doping of phosphorous) are equal, namely Vg=0 V (Vg is the gate voltage). For this reason, while p type semiconductor layer is used in the region constituting the channel, depending on the setting of this threshold voltage, the channel can be formed by selecting n type layer.

Since the element of the present invention is insulated from the substrate, even if integrated on the same substrate or chip, each is an independent element and separation between elements can be made in good conditions. Therefore, it hardly causes latching up, which posed problems in the conventional CMOS construction, and it is also possible to avoid soft errors caused by α-ray, cosmic ray, etc.

When the semiconductor layer thickness is further reduced, the channel control by gate electrode will work more forcefully. Therefore, in silicon channel it is possible to obtain good thin film transistor characteristics by making the thickness to around 0.1 μm through 0.05 μm.

Here, SOI substrate structure was formed by use of the oxidation method. However, it is possible to produce the device structure of the present invention by using SOI substrates, obtained by forming oxide film layer within the substrate after ion implantation of highly concentrated oxygen into the substrate (the so-called "SIMOX"), or obtained by forming the recrystallized layer of silicon on oxide film layer, or obtained by sticking together single crystal layers of silicon, sandwiching the silicon oxide layer; or by using SOS (silicon on sapphire) substrates.

EMBODIMENT 2

In the device structure of the Embodiment 1, in the condition when the insulating layers extending from both sides are not connected to the lower part of the semiconductor layer, the effect of the separation between the element and the substrate by electric insulation will be lost. However, it is possible to have good control of electric characteristics of the channel due to field effect made by the gate on both sides, with respect to the channel produced in thin film semiconductor, or to maintain characteristics of the element suitable to integration.

Figure 3A:
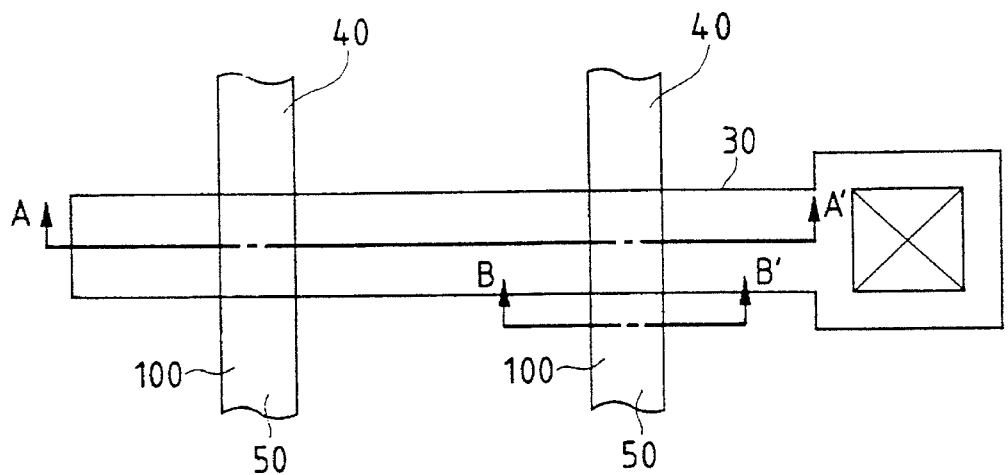
FIG. 3a is a plan view showing the semiconductor device in an embodiment of the present invention.
Figure 3B:
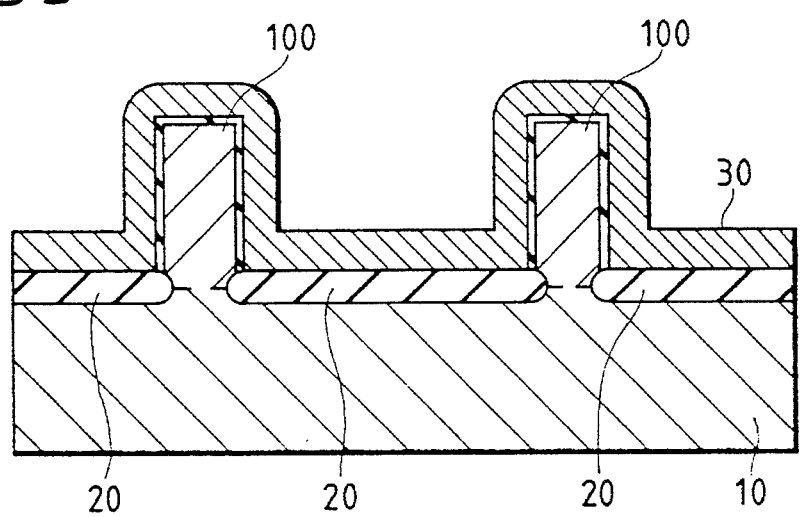
Figure 3C:
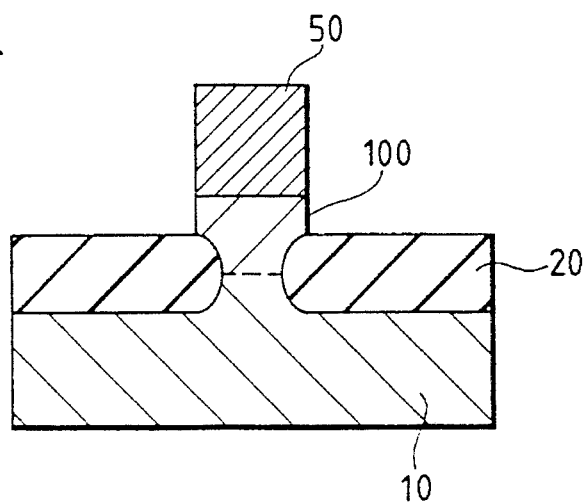

FIGS. 3a through 3c show the construction of such element. FIG. 3a is a plan view, FIG. 3b an A–A' section of FIG. 3a, and FIG. 3c a B–B' section of FIG. 3a. It is of a construction, where the semiconductor layers 100 of two transistors jointly possess the gate electrode 30. As shown in FIG. 3c, in such a structure, the stable electric characteristics can be obtained by forming the diffusion layers of the source and drain electrodes within the semiconductor layer 100 at a shallower level than the field oxide film (namely, being shifted upward) and also forming the gate electrode at a deeper level (namely, closer to the substrate). In such construction where the substrate crystal and the thin film (the semiconductor layer) are connected to each other, it is possible to form the insulating layer 20, having an opening, on the substrate, and to have epitaxial growth of the substrate crystal from such opening, thereby obtaining the semiconductor layer 100.

EMBODIMENT 3

Figure 4A:
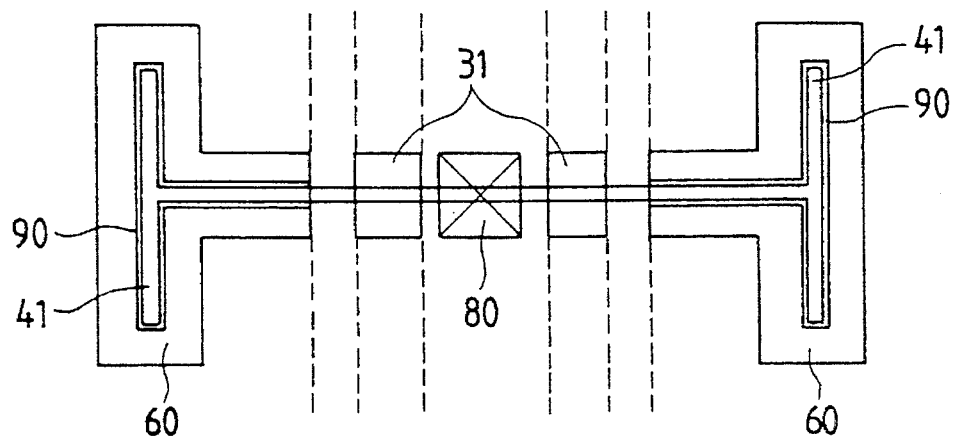
FIG. 4a is a plan view showing the semiconductor memory device in an embodiment of the present invention.
Figure 4B:
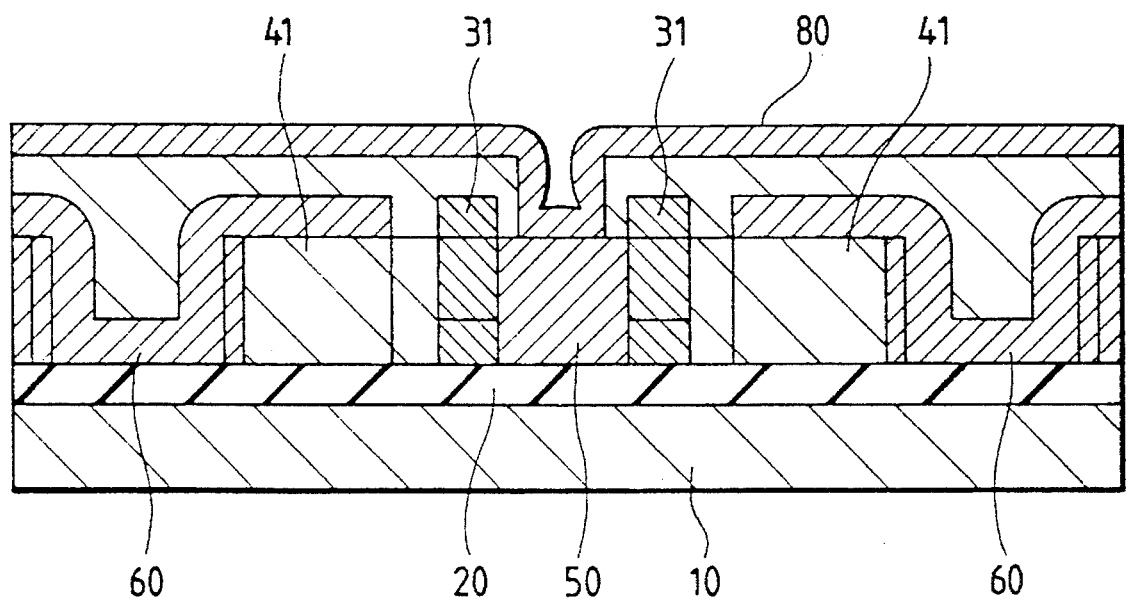

FIGS. 4a through 4e show an embodiment where the present invention is applied in DRAM (dynamic random-access memory) cell. FIG. 4a is a plan view, and FIG. 4b a side perspective view. Instead of providing contact to the source electrode of the transistor shown in FIG. 1 with wiring, the source electrode is covered by the capacitor insulating film 90 all around, in a similar manner as the gate insulating film, on which the plate electrode 60 is disposed, thereby forming the capacitor portion 41. In FIGS. 4a and 4b, a two bit memory is constructed by word line 31 and bit line 80. As shown in FIG. 4a, it is possible to increase the capacity by increasing the surface area, in complicating the layout of capacitor portion 41 and turning it into a "T" letter form.

Word line 31, bit line 80 and plate electrode 60 were constructed of polycrystalline silicon, doped with highly concentrated phosphorous, for example.

In case the semiconductor device of the present invention is used in the word portion (switch transistor), it is possible to suppress the current leakage by lowering the word potential by Vbi with respect to the potential on the lower bias side (source), in the condition where transistor is off, thereby extending the period of holding the memory information. Here, Vbi is Fermi level difference between the source electrode diffusion layer and the semiconductor layer of the channel. For example, in an element where n type is used, when Vbi=0.6 V and the potential on the lower bias side is 0 V, the word writing level should be set at −0.6 V.

Figure 4C:
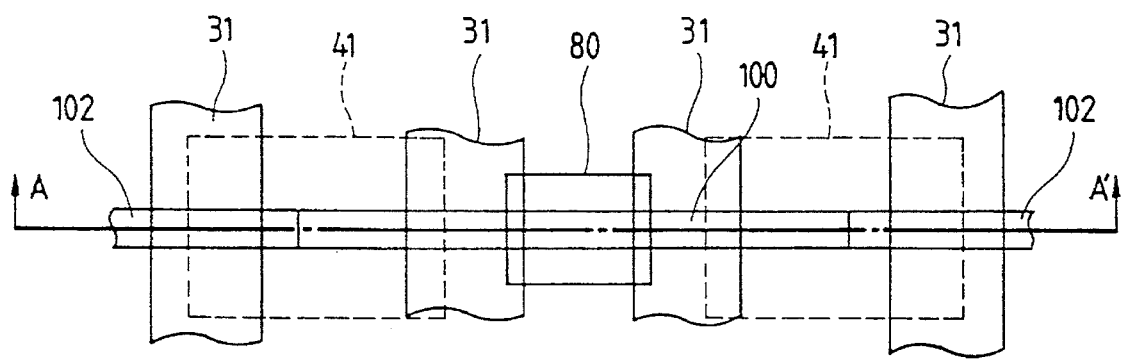
Figure 4D:
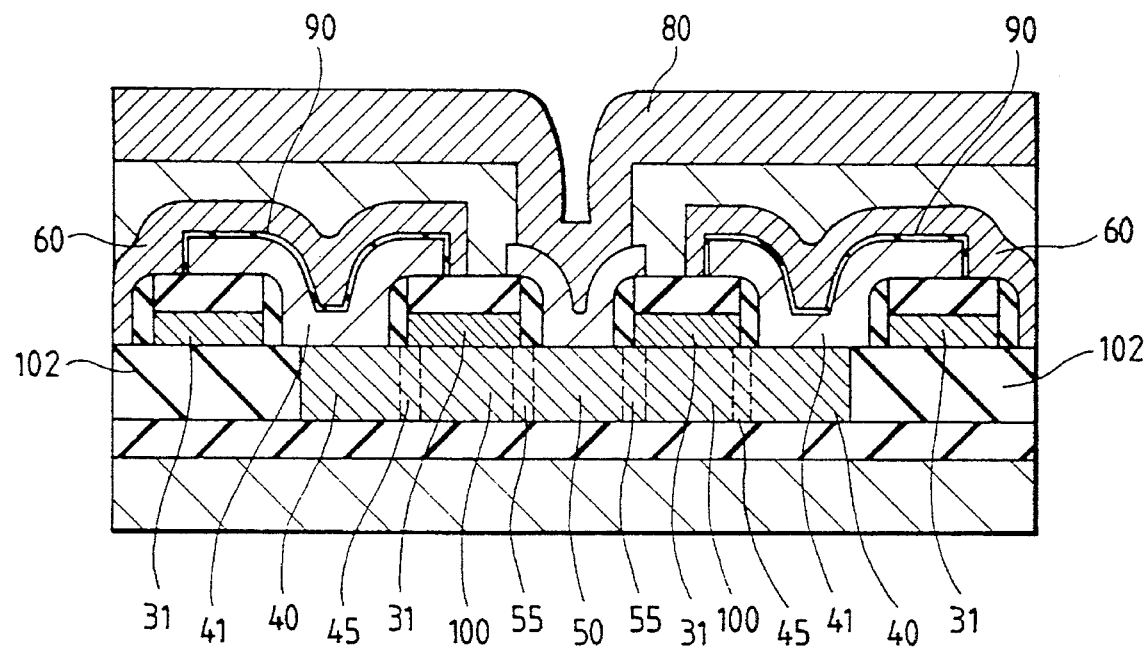
FIG. 4d is a sectional view of the semiconductor memory device shown in FIG. 4c.
Figure 4E:
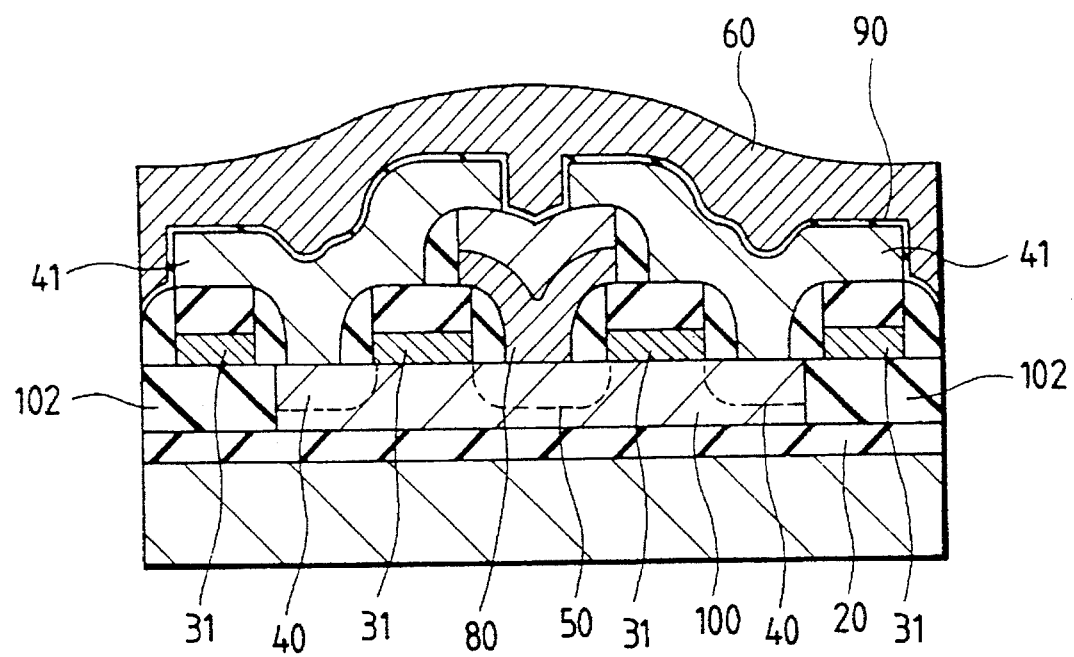

Further, as shown in FIGS. 4c, 4d and 4e, it is possible to increase the capacity by stacking the capacitor portion 41 on thin film semiconductor. FIG. 4c is a plan view, FIG. 4d a sectional View of FIG. 4c at A–A' line. Low concentration impurities diffusion layers 45, 55 were formed on the channel side of source electrode 40 and drain electrode 50, thereby forming a transistor of DDD (double diffusion drain) type. Further, FIG. 4e is a modified example of the present embodiment. As shown in the diagram, the bit line 80 is formed after forming the word line 31, and the capacitor portion 41 may be stacked on thereafter. Numeral 102 denotes the silicon oxide layer.

EMBODIMENT 4

Figure 5:
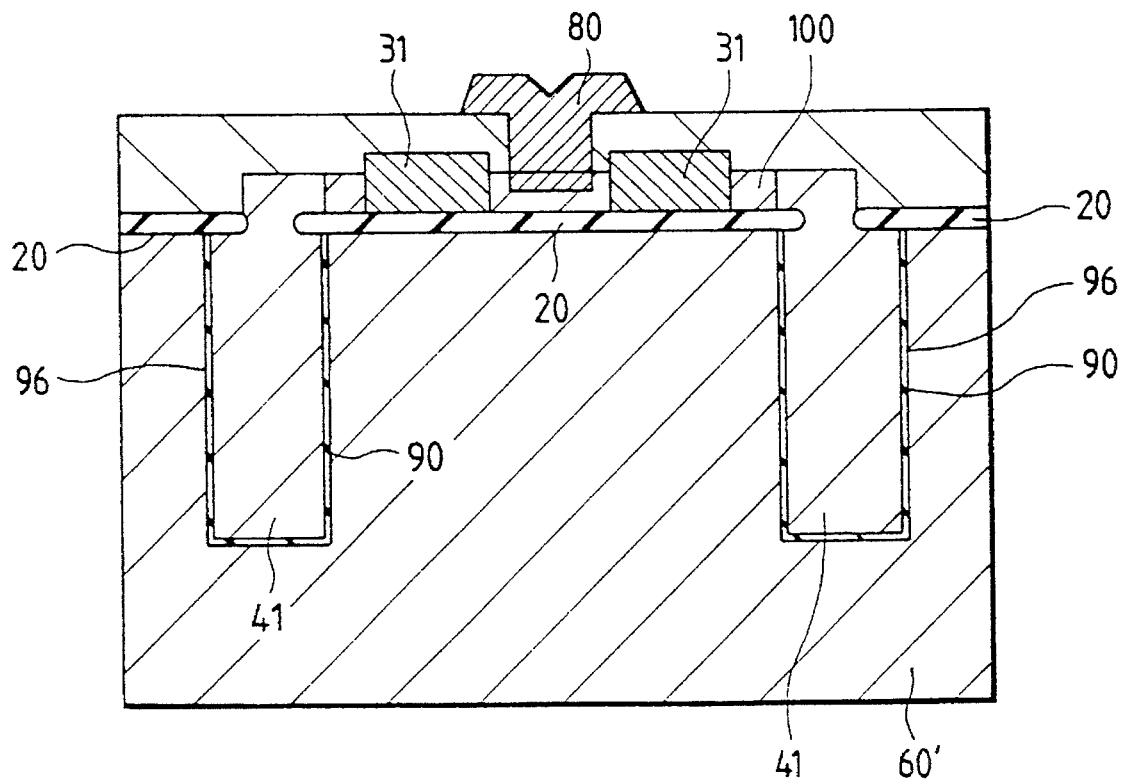
FIG. 5 is a sectional view of the semiconductor memory device in an embodiment of the present invention.

FIG. 5 is a sectional view of the element showing an embodiment, using the present invention in the DRAM cell of trench type, and FIGS. 6a through 6e are process diagrams showing manufacturing method thereof. In FIG. 5 the capacitor portion 41 is inside the trench 96, which is dug in the substrate, and its periphery is made of the substrate plate 60', sandwiching the capacitor insulating film 90.

In using the semiconductor layer 100 above the field oxide film 20, via thin film transistor in which the word line 31 is the gate, it is possible to write electric charge information into the capacitor portion 41 from bit line 80.

Since the transistor having the construction of the present invention is separated from the substrate electrically, it is not affected by the substrate electrically. Therefore, it is possible to set the electric potential of the plate, namely the substrate, arbitrarily. While the substrate is used as a plate here, the same will apply when the plate is constructed of the well layer, which is formed in the substrate, where such well layer has high conductive property by making the concentration of impurities higher than that of the substrate.

In using FIGS. 6a through 6e, the forming method of the element in the embodiment in FIG. 5 will be explained.

Figure 6A:
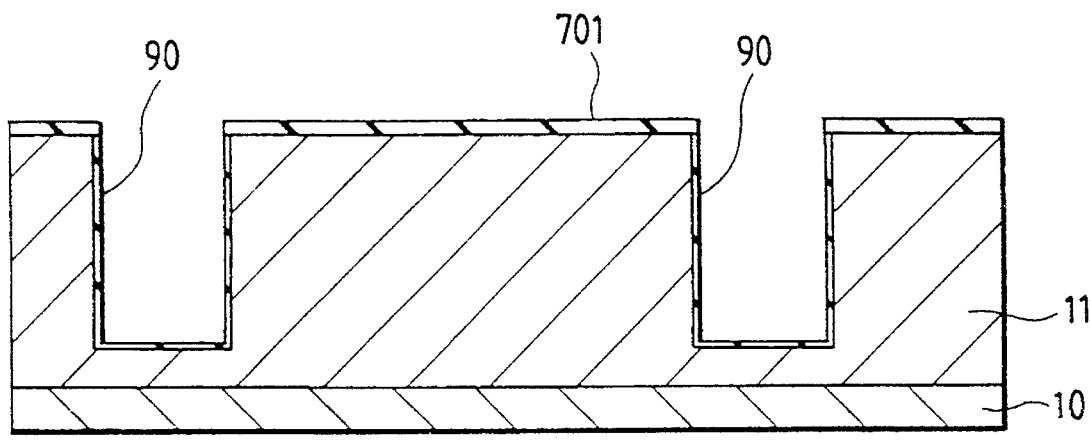
FIGS. 6a through 6e are sectional views showing the manufacturing process of the semiconductor memory device shown in FIG. 5.

The process shown in FIG. 6a; boron with a concentration of $1\times10^{12}$ cm$^{-2}$ is ion implanted, and then diffused by heat treatment, thereby forming p type well 11 on the silicon substrate 10. Surface of such silicon substrate 10 is thermally oxidized, thereby forming an oxide film (not illustrated) of around 20 nm in thickness, on which silicon nitride film 701 is deposited for around 20 nm in thickness by CVD (chemical vapor deposition) method. Then, the trench patterns are formed on the photoresist. Using them as mask the silicon nitride film 701 is etched anisotropically by RIE method and, further, the substrate is etched for around 5 μm vertically by RIE method, thereby forming the trench. Thereafter, the photoresist is removed, and the capacitor insulating film 90 is formed on the trench surface.

Figure 6B:
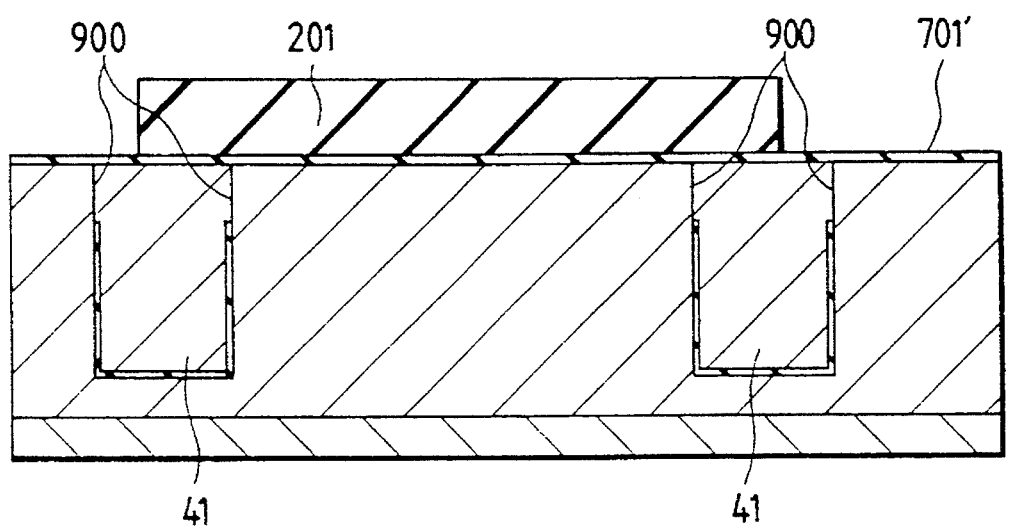

The process shown in FIG. 6b; polycrystalline silicon is deposited on the entire surface of the above substrate by CVD method for ½ or more of the trench diameter, then it is etched back so as to remove polycrystalline silicon to a depth of around 500 nm from the substrate surface, thereby leaving polycrystalline silicon, which becomes the capacitor portion, inside the trench. Etching back method means the etching in vertical direction to the substrate after deposition, in utilizing the fact that the substrate surface is nearly flattened when the groove pattern on the substrate generated by anisotropical etching, etc. is covered by isotropic deposition to a thickness of ½ or more of the largest width of groove pattern. This is a method of leaving the deposition only at the groove portion which had been formed.

The capacitor insulating film 90 is etched by using the above polycrystalline silicon as mask, thereby opening the side wall 900 in upper portion of the trench. Thereafter, deposition of polycrystalline silicon and etching back are repeated, thereby packing polycrystalline silicon inside the trench, in forming the capacitor 41. Thereafter, silicon nitride film 701 is removed by wet etching with mixture of thermal phosphoric acids, then silicon oxide is deposited for 20 nm (not illustrated), and again silicon nitride film 701' is deposited for 50 nm. Thereafter, photoresist 201 is patterned for forming the semiconductor layer.

In the above process, without making deposition of silicon oxide and silicon nitride film, after forming the semiconductor layer and thermal oxidation in the subsequent process, deposition of silicon nitride film may be made.

Figure 6C:
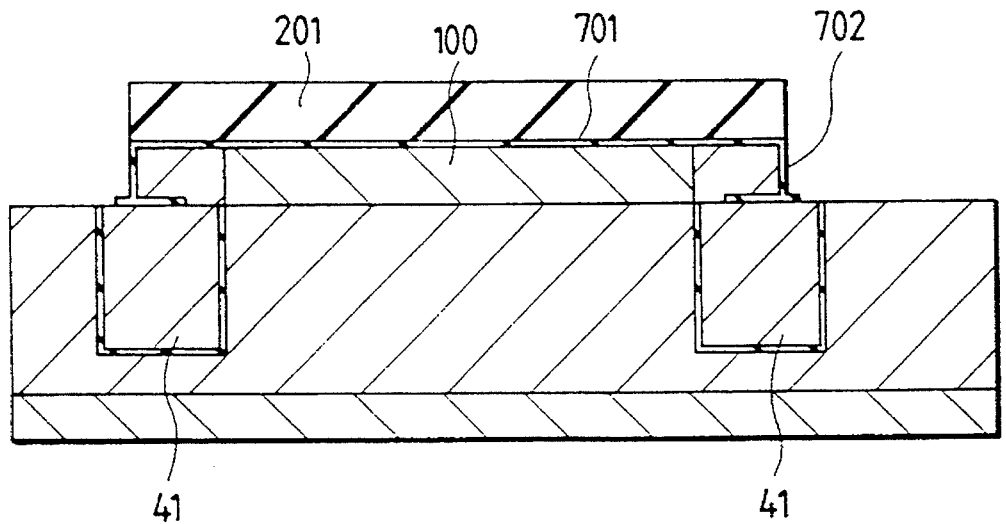

The process shown in FIG. 6c; the semiconductor layer 100, which becomes a transistor, is formed by etching the substrate vertically based on the mask of the above photoresist 201. After such semiconductor layer 100 is thermally oxidized and the oxide film of 10 nm is grown on the semiconductor surface, silicon nitride film 702 is deposited for 20 nm, and, then, there is applied the mask for forming the draw-out portion on a part of the upper surface of trench, which faces the semiconductor layer 100, in order to protect the connection between the capacitor portion 41 and the semiconductor layer 100 as well as the semiconductor layer 100. Thereafter, the semiconductor layer 100 and the draw-out portion of trench are covered with silicon nitride films 701', 702 by anisotropical etching. Here, it is possible to set a concentration of impurities and "p" type of the substrate, which becomes the plate electrode, independently of the channel, by ion implantation of the well impurities to $1\times10^{13}$ cm$^{-2}$.

Figure 6D:
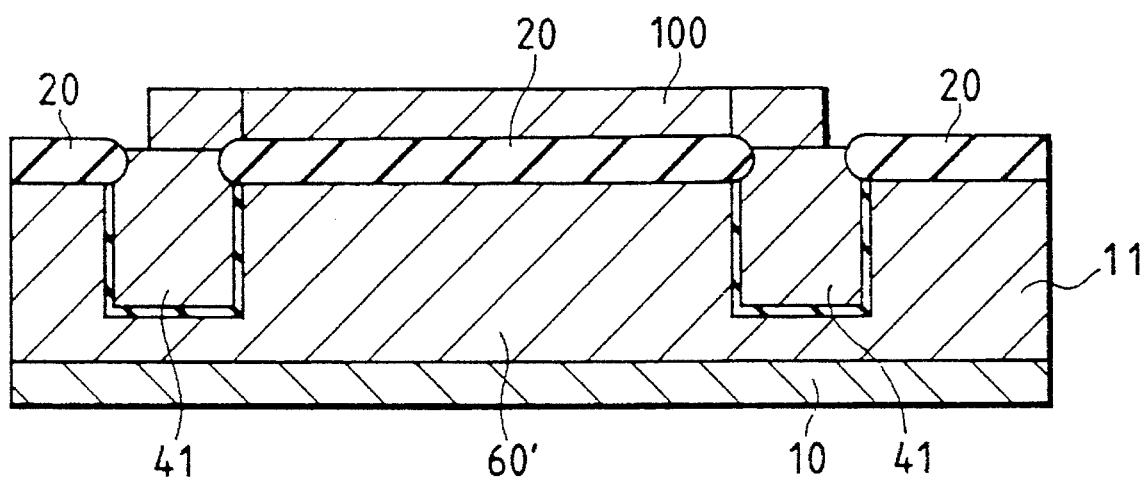

The process shown in FIG. 6d; thick insulating film 20 is formed by removing photoresist 201 from the above substrate and by field oxidation, and the semiconductor layer 100, which becomes the channel, is insulated and separated from the substrate. At this time, since the portion which connects the semiconductor layer 100 and the capacitor portion 41 electrically is covered with the above silicon nitride film 702, the oxide film does not grow and electric conductivity is maintained. Thereafter, silicon nitride film 702 is removed.

Figure 6E:
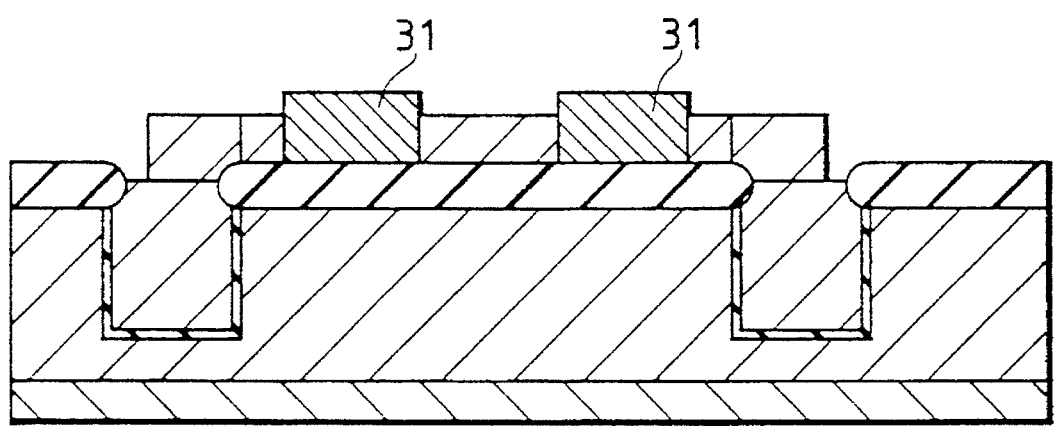

The process shown in FIG. 6e; after thin film surface is oxidized and the gate insulating film of 20 nm in thickness (not illustrated) is formed, the word line 31 is formed.

Hereinafter, the process of wiring, etc. is the same as those in Embodiment 1.

In the present embodiment, there is one transistor consisting of the thin film semiconductor with respect to one trench capacitor. Against the above, by forming a plurality of semiconductor layers, which constitute the channel, with respect to one trench capacitor, it is possible to substantially increase the channel width of transistor and to increase the current flowing therein.

EMBODIMENT 5

Figure 7A:
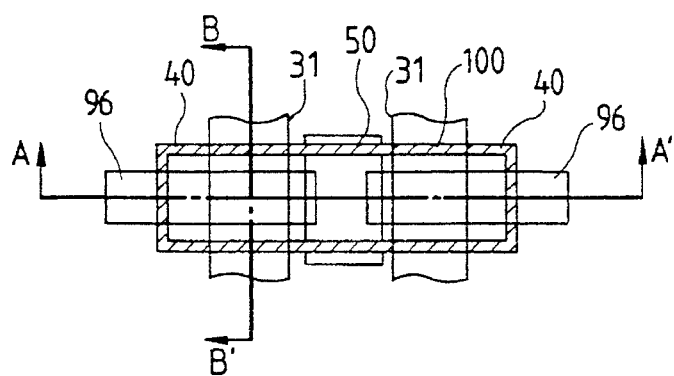
FIG. 7a is a plan view of the semiconductor memory device in an embodiment of the present invention.
Figure 7B:
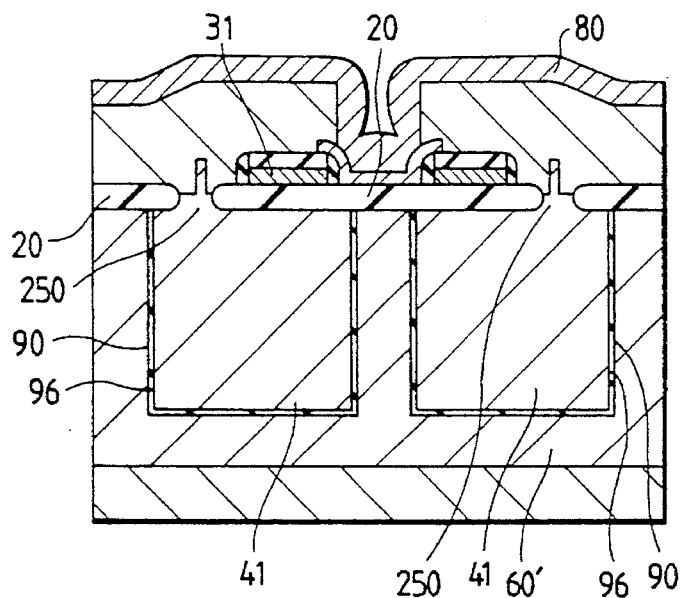
Figure 7C:
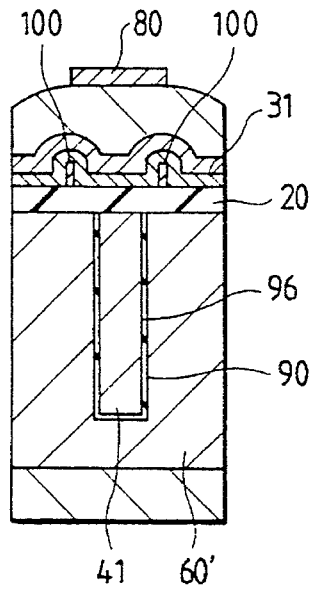

It is possible to reduce the plane space by making the channel into a vertical thin film,in using the device of the structure under the present invention as a selective transistor. As shown in FIGS. 7a through 7c, it is possible to effectively use the region, which had been used only as the isolation region up to now in DRAM, as the transistor region. Therefore, this is effective in reducing the memory cell area or increasing the storing capacity. FIG. 7a is a plan layout of DRAM having 2 cells, FIG. 7b an A–A' section of FIG. 7a, and FIG. 7c a B–B' section of FIG. 7a.

The capacitor portion 41 can be laid out to have the maximum area in memory cell, excepting the regions necessary for isolation between adjoining capacitor portions. The semiconductor layer 100 sandwiches this capacitor portion 41 and the word line 31 can traverse above the capacitor portion. Further, since the surface is covered with field oxide film 20, excepting the opening 250 of the trench, it is not necessary to consider layout of the capacitor portion 41, in forming of the contact, etc. thereon.

EMBODIMENT 6

Figure 8:
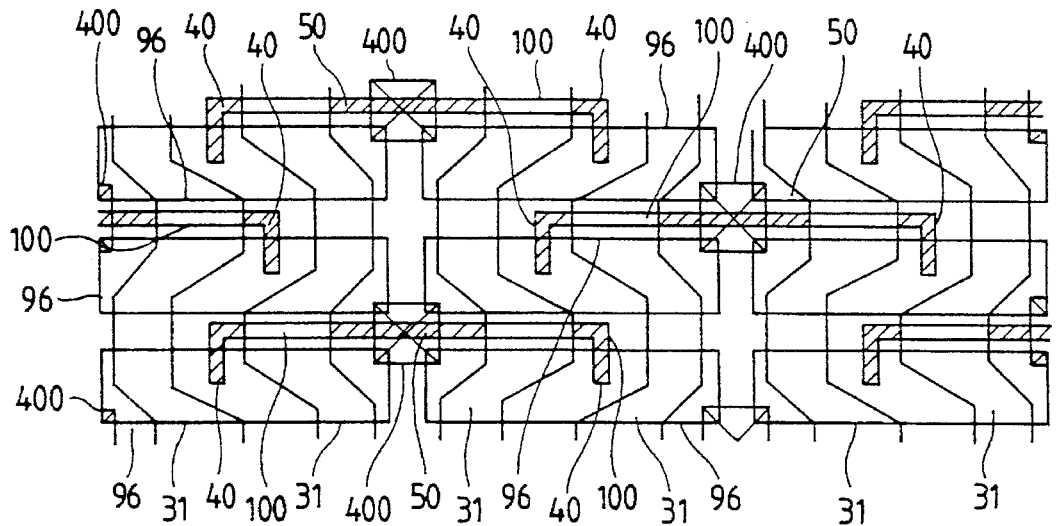
FIG. 8 is a plan view of the semiconductor memory device in an embodiment of the present invention.

FIG. 8 is a drawing for an embodiment of memory cell for DRAM which can realize minute memory cell area. It shows the memory cell layout of folded bit line type, using the thin film semiconductor as a channel of the selective transistor. Numeral 400 shows the bit line contact.

EMBODIMENT 7

Figure 9A:
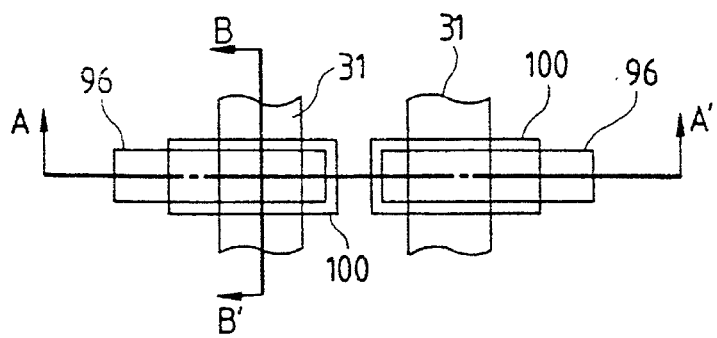
FIG. 9a is a plan view of the semiconductor memory device in an embodiment of the present invention.
Figure 9B:
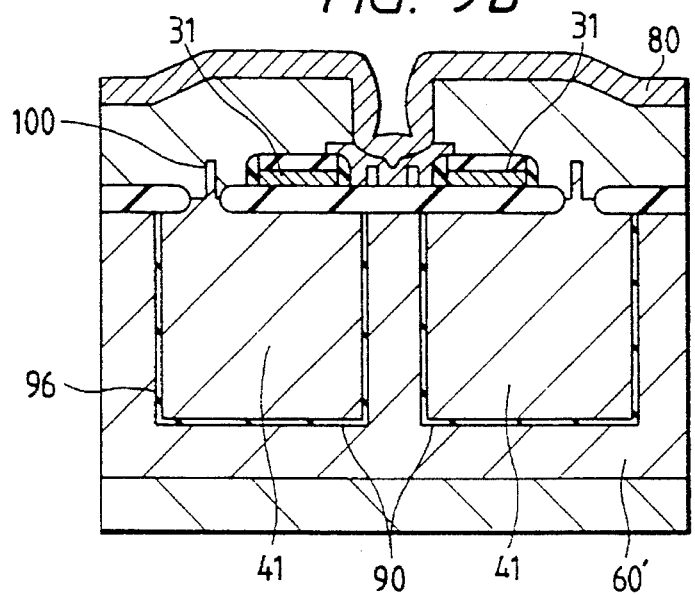
Figure 9C:
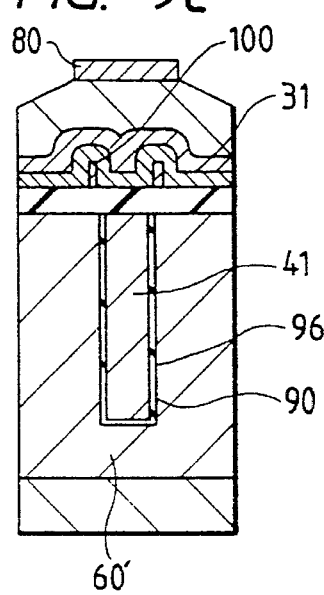
Figure 10A:
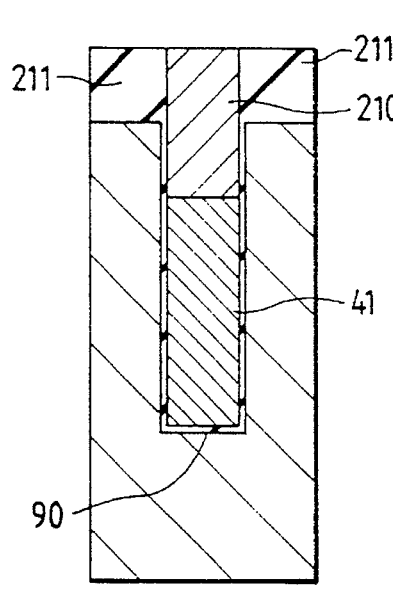
FIGS. 10a and 10b are sectional views showing the manufacturing process of the semiconductor memory device shown in FIGS. 9a through 9c.
Figure 10B:
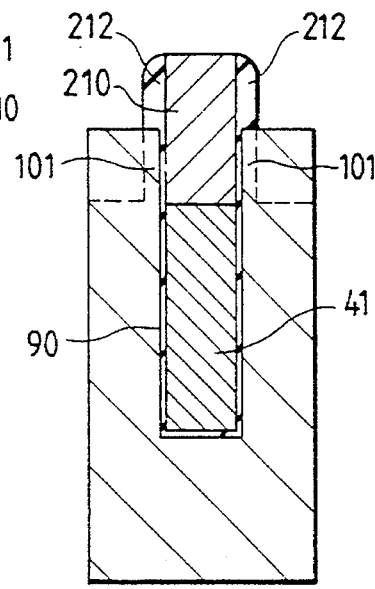

FIGS. 9a through 9c show the semiconductor layer (channel thin film) 100, which had been self-aligned with trench mask. FIG. 9a is a plan view showing the layout of two cells, FIG. 9b an A–A' section of FIG. 9a, and FIG. 9c a B–B' section of FIG. 9a. FIGS. 10a and 10b show the manufacturing process thereof.

The process shown in FIG. 10a; silicon oxide 211 is deposited on the substrate for around 500 nm, then patterning is carried out for forming the trench, thereby forming the trench, using it as the mask. After forming the capacitor portion 41 within the trench, photoresist is applied and etching back is made, thereby filling photoresist 210 to the surface level of the silicon oxide.

The process shown in FIG. 10b; silicon oxide 211 is removed thereafter, and the spacer 212 is provided on the side wall of photoresist, using the difference in level between substrate surface and photoresist. After deposition in uniform thickness isotropically on the pattern having difference in level, the deposition is etched only in the film thickness perpendicularly to the substrate, thereby leaving the deposition only on the side wall, having such difference in level. Hereinafter, the deposition formed in such a manner is to be called the spacer. By etching the substrate using the above spacer as the mask, it is possible to form the semiconductor layer 101, which has been self-aligned with the trench pattern.

Figure 10C:
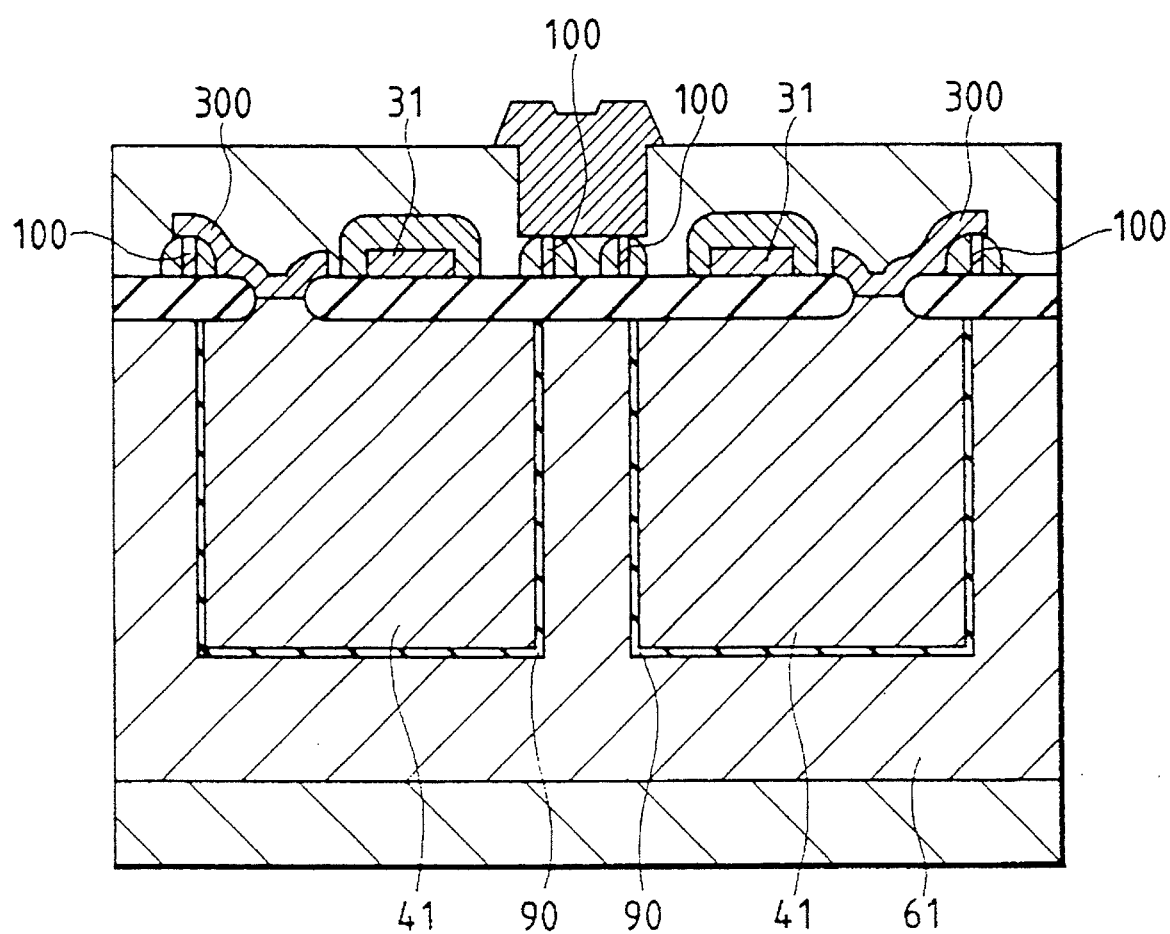
FIG. 10c is a sectional view showing a modified example of the semiconductor memory device shown in FIGS. 9a through 9c.

FIG. 10c shows a sectional view of a modified example of the present embodiment. A connect ion can be made to the semiconductor layer 100 around the trench, using the drawing-out layer 300, from the capacitor portion 41. Numeral 61 shows the buried n$^+$ layer.

EMBODIMENT 8

Figure 11A:
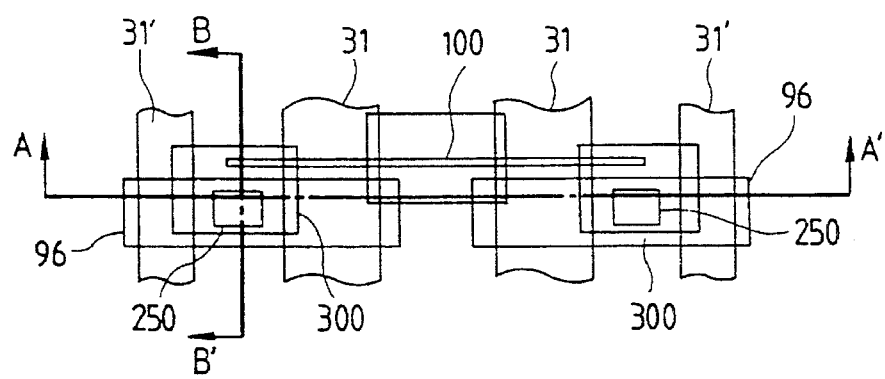
FIG. 11a is a plan view of the semiconductor memory device in an embodiment of the present invention.
Figure 11B:
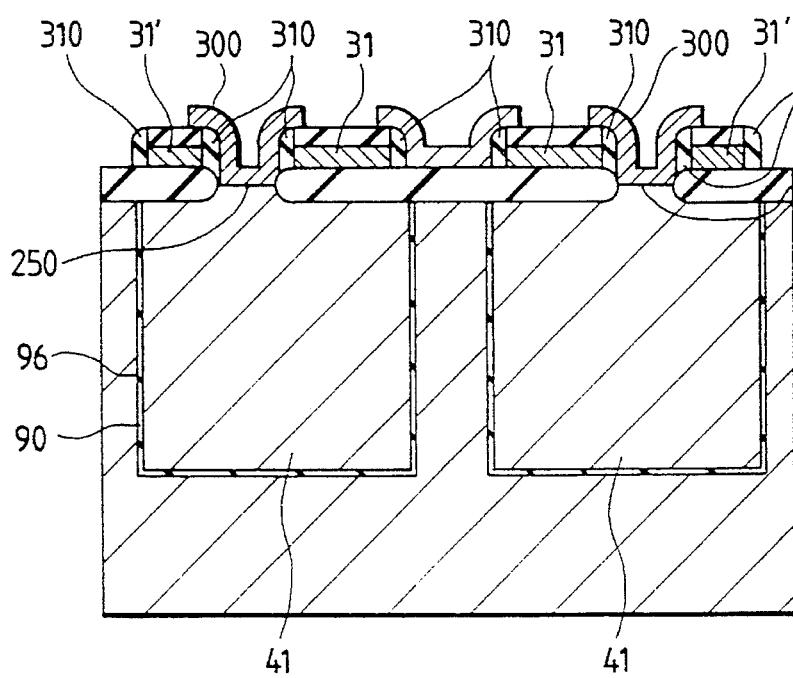
Figure 11C:
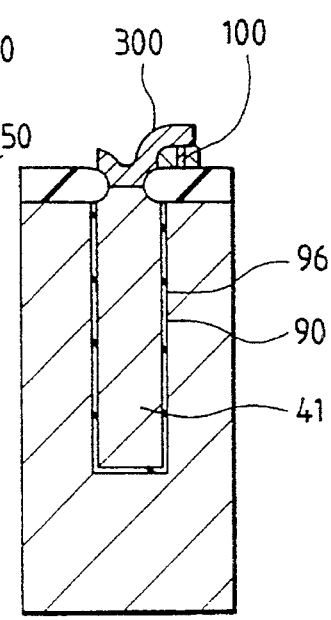

FIG. 11a shows a plan layout of two cells in the folded bit line type arrangement, FIG. 11b an A–A' section of FIG. 11a, and FIG. 11c a B–B' section of FIG. 11a. The capacitor portion 41 within trench 96 connects to the semiconductor layer 100 from the trench opening 250 through the drawing-out layer 300. The drawing-out layer 300 can be formed in self-alignment with word lines 31, 31', by forming the spacer 310 of silicon oxide on the side wall of word lines 31, 31'.

EMBODIMENT 9

Figure 12:
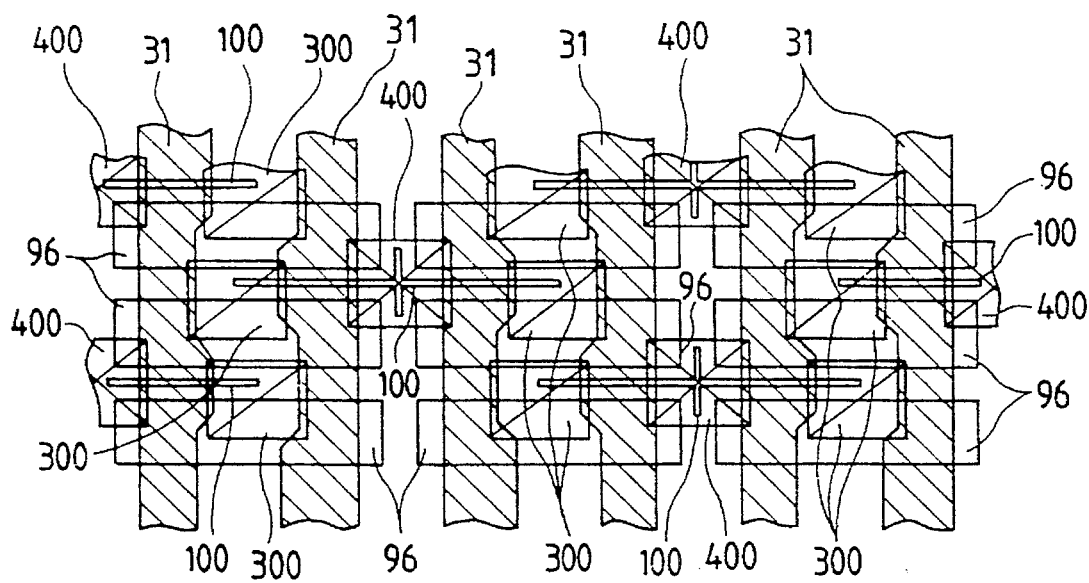
FIG. 12 is a plan view of the semiconductor memory device in an embodiment of the present invention.

FIG. 12 is a plan view showing the folded bit line type arrangement, when the semiconductor layer 100 is provided by utilizing the substrate silicon between adjoining cells. The capacitor portion 41 is connected to the semiconductor layer 100 through the drawing-out layer 300. Selective transistors are constructed in the semiconductor layer 100 by word lines 31, and are connected to the data lines (not illustrated) via the bit line contact 400.

Figure 13A:
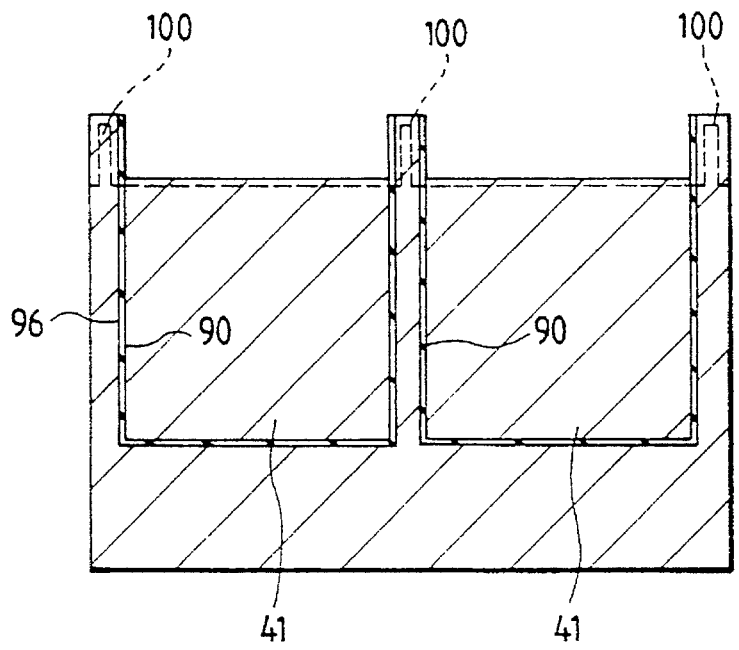
FIGS. 13a and 13b are sectional views showing the manufacturing process of the semiconductor memory device shown in FIG. 12.
Figure 13B:
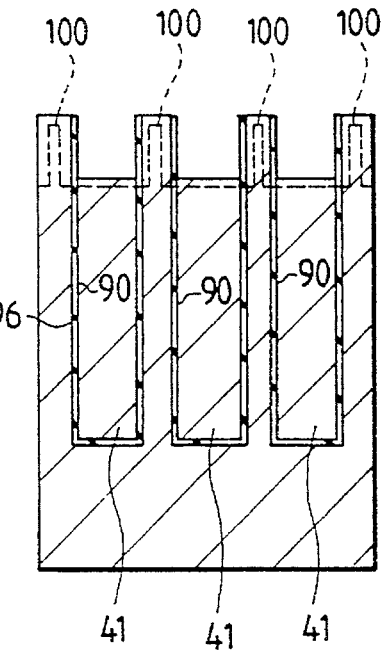

The element shown in FIG. 12 is manufactured in the following manner. As shown in FIGS. 13a and 13b, after the trench is dug in the substrate and the capacitor portion 41 is formed, the protrusion is made smaller by isotropic etching, thereby forming the semiconductor layer 100 of the predetermined thickness. In this process, the semiconductor layer 100 may be formed by having the surface layer of semiconductor layer made into an oxide film by thermal oxidation and the protrusion reduced in size by removing the silicon oxide. Under these methods, it is possible to form the semiconductor layer 100, which becomes the channel, through self-alignment between the adjoining trenches 96. Therefore, it is suitable to high integration, since the distance to the adjoining trenches can be made uniform. Thereafter, the semiconductor layer 100 can be formed in self-aligned manner, by removing the semiconductor layer 100 which does not use for the channel, after forming the field oxide film. This removing process can be carried out by masking the active region usable as channel, etc. , and etching it. Alternately, the thin film semiconductor outside the active region can be left separated from the active region, by the inactivation of the thin film semiconductor outside the active region employing thermal oxidation, etc.

EMBODIMENT 10

Figure 14A:
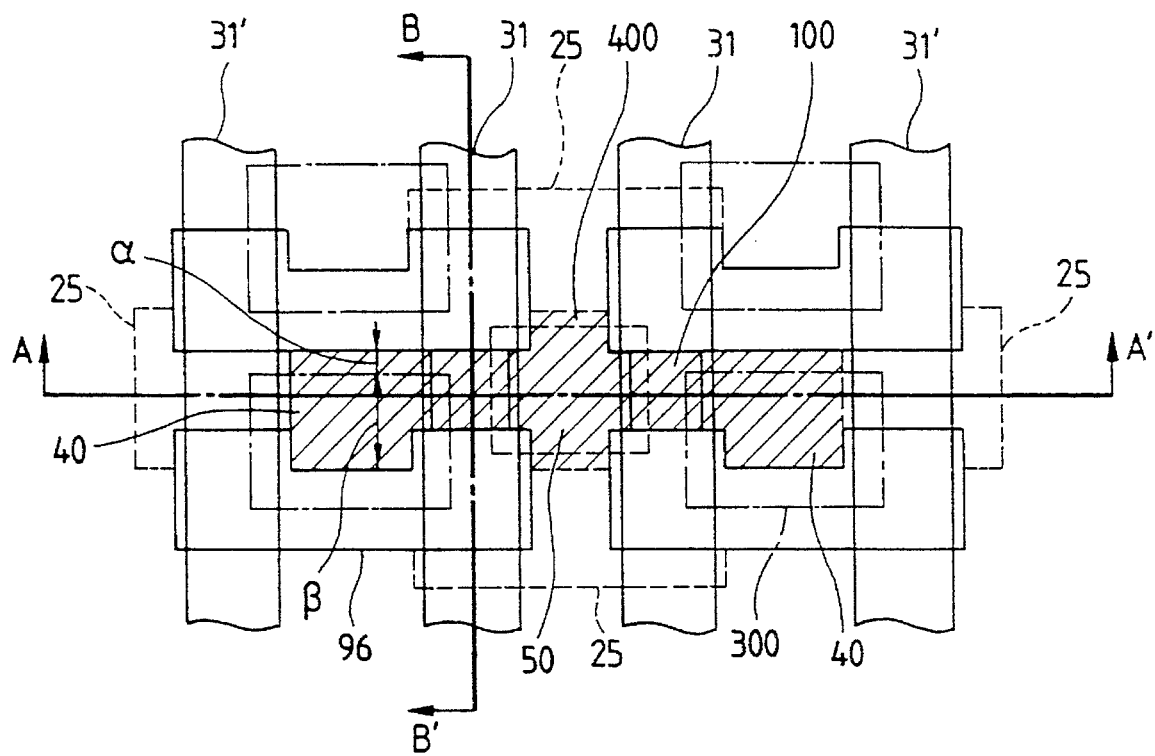
FIG. 14a is a plan view of the semiconductor memory device in an embodiment of the present invention.
Figure 14B:
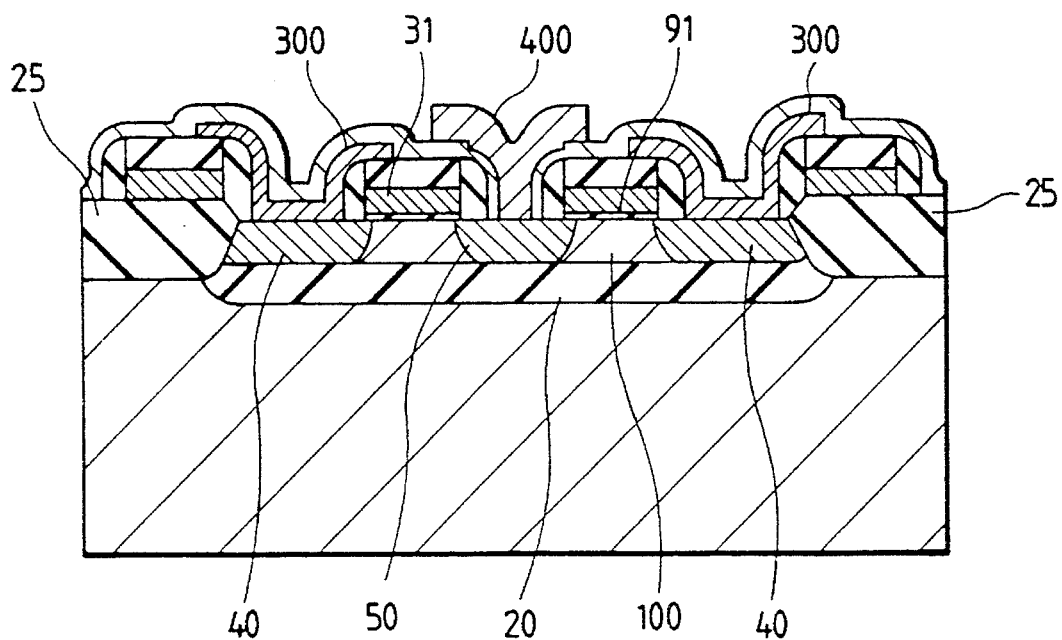
Figure 14C:
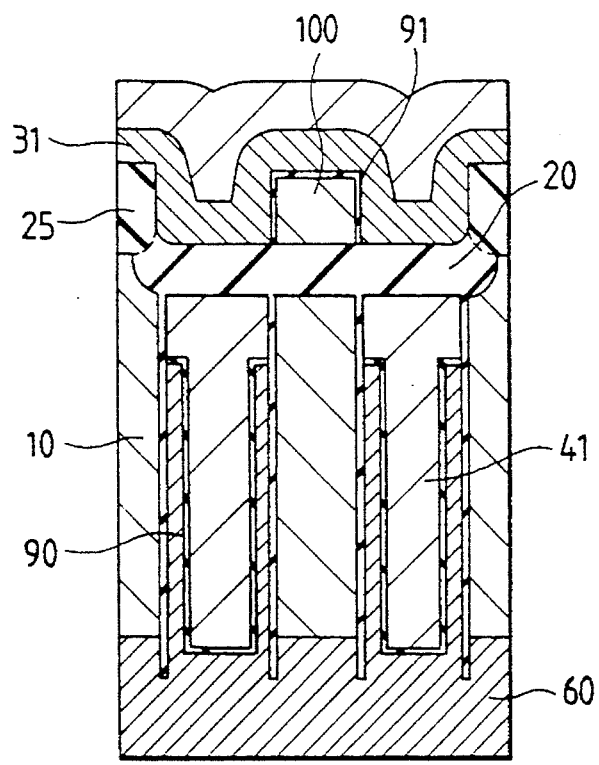
Figure 14D:
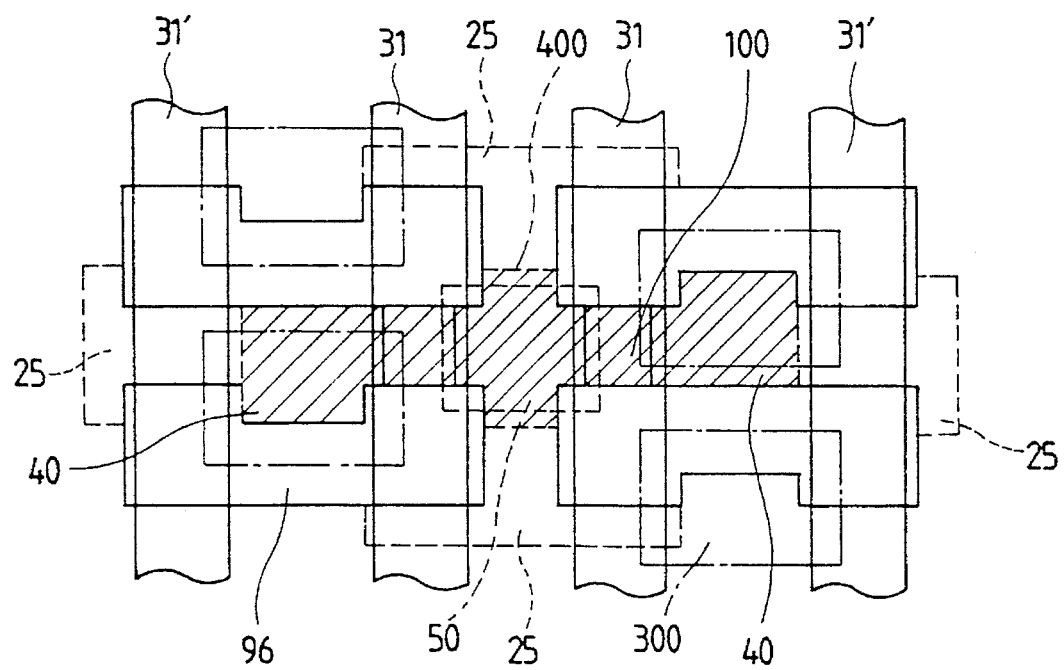

Further, it is possible to form the trench and the semiconductor layer 100 simultaneously, when the trench is formed, by etching at an interval of around 0.1 to 0.2 μm. FIG. 14a is a plan layout of four bit memory cell of folded bit line type, FIG. 14b an A–A' section of FIG. 14a, and FIG. 14c a B–B' section of FIG. 14a. FIG. 14d is a plan layout of the memory cell in a modified example of the present embodiment.

In the embodiment shown in FIGS. 14a through 14d, it is possible to form the semiconductor layer 100 having silicon oxide layer 25 partially, by opening the trench 96 after forming the field oxide film 25 of around 500 nm in thickness on the substrate surface through thermal oxidation.

In this device, since the adjoining electrodes are separated electrically by the field oxide film 25 which had been provided initially, even if the forming of the field oxide film 20 formed under the thin film semiconductor is inadequate, the leakage between cells can be suppressed. Further, when the drawing-out layer 300 is formed, by forming the trench 96 in concave shape when looked in plan view, it is possible to increase the layout margin of isolations α with respect to the adjacent trench or the layout margin between patterns β with respect to the thin film semiconductor. Further, the trench may be laid out in symmetrical position, as shown in FIG. 14d.

The above "α" is the distance between the drawing-out layer 300, shown with a frame of one-point chain line, and the trench 96 in FIG. 14a. The above "β" is the distance between the drawing-out layer 300, shown with a frame of one-point chain line, and the hatched region (the frame of this region depends on the trench) in FIG. 14a.

In the construction of the present embodiment, the capacitor portion is separated by being field oxidized, together with the substrate, thereby decreasing the restrictions for forming the channel at the time of forming the capacitor portion.

EMBODIMENT 11

Figure 15A:
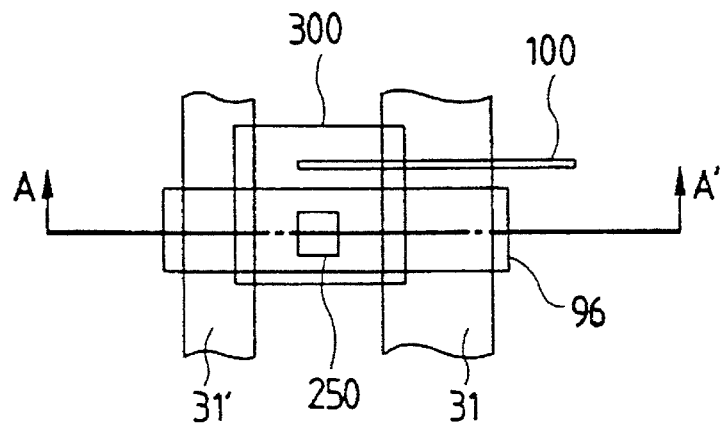
FIG. 15a is a plan view of the semiconductor memory device in an embodiment of the present invention.
Figure 15B:
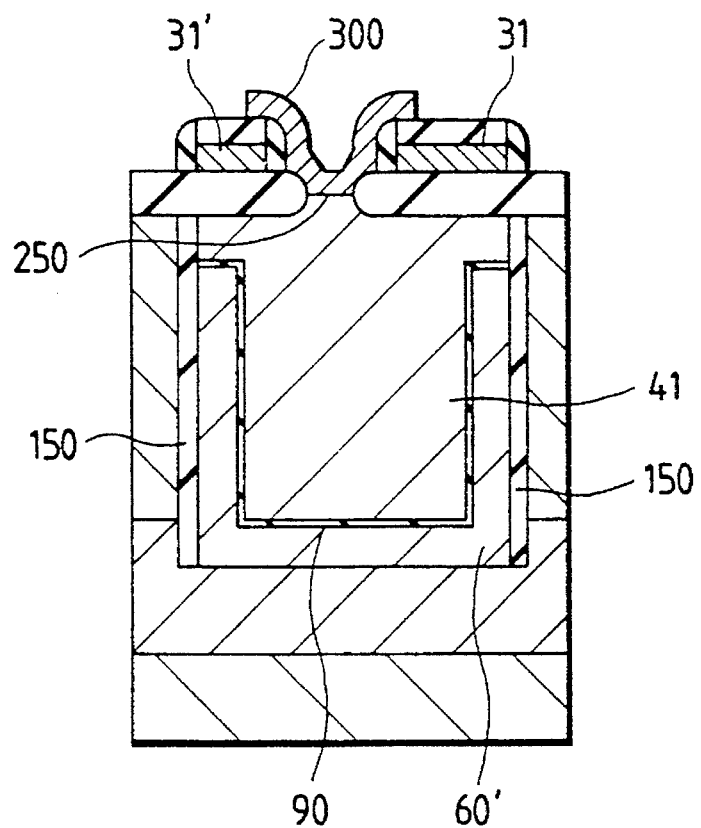

As another embodiment, the capacitor portion 41 may be surrounded by the plate electrode 60', as shown in FIGS. 15a and 15b. In this case, since the plate electrode 60' and the capacitor portion 41 can both be made of polycrystalline silicon, for example, there is little danger that impurities in the insulating film or impurities generated in forming the insulating film contaminate the surface or inside of the substrate. Therefore, it is possible to use various materials such as $Ta_2O_5$, Hf oxide, etc. for the capacitor insulating film 90. FIG. 15a is a plan layout of one cell, and FIG. 15b an A–A' section of FIG. 15a. In forming the semiconductor device of the embodiment shown in FIGS. 15a and 15b, after the trench is formed, silicon oxide film 150 is formed on its side wall, thereby forming the plate electrode 60, in FIGS. 14a through 14c. Further, after the capacitor insulating film 90 is formed, the capacitor portion can be formed by filling with the capacity storing electrode 43.

EMBODIMENT 12

Figure 16A:
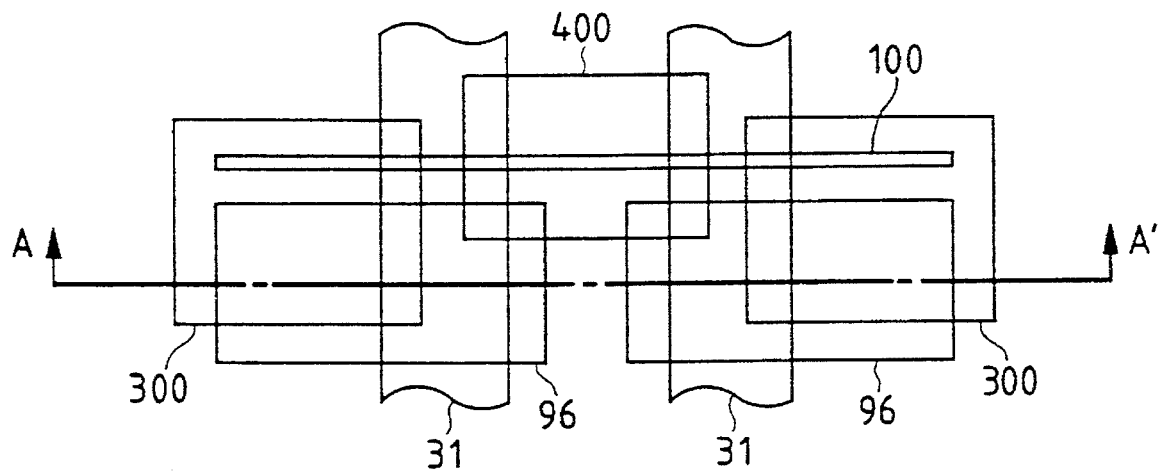
FIG. 16a is a plan view of the semiconductor memory device in an embodiment of the present invention.
Figure 16B:
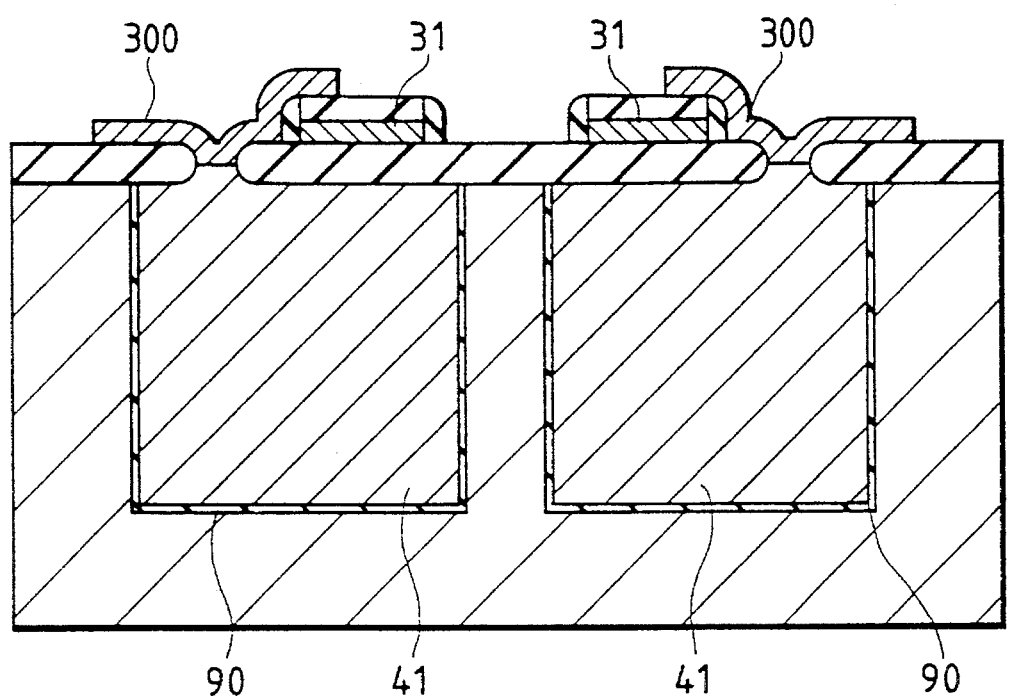

FIGS. 16a and 16b show another embodiment according to the open bit line type arrangement. FIG. 16a shows a plan view of two cells, and FIG. 16b an A–A' section of FIG. 16a.

EMBODIMENT 13

Figure 17A:
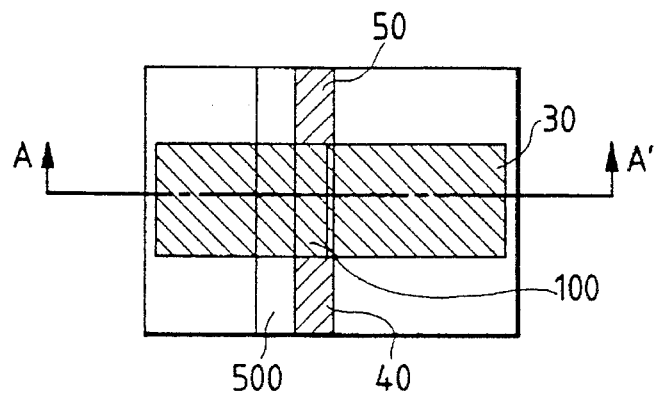
FIG. 17a is a plan view of the semiconductor device in an embodiment of the present invention.
Figure 17B:
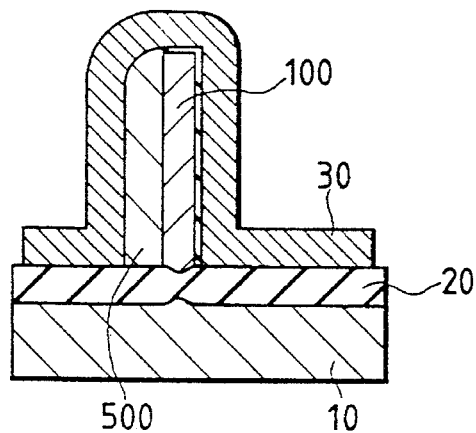
Figure 17C:
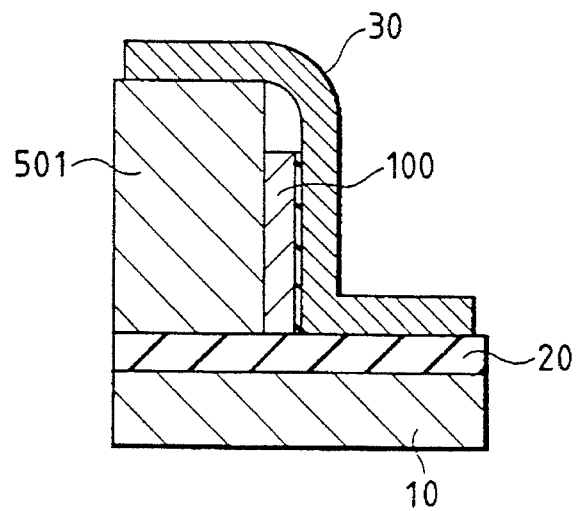

Further, as shown in FIGS. 17a through 17c, the gate can be disposed to only one side of the semiconductor layer 100, by adequately thinning the semiconductor layer 100. In this element, the semiconductor layer 100 may be set to be a thin film of 0.1 μm in thickness. FIG. 17a is a plan layout with one gate, and FIG. 17b is an A–A' section of FIG. 17a. By forming the spacer 500 of silicon oxide on one side of the semiconductor layer 100, on which the gate electrode 30 is laid, and, together with the source electrode 40 and drain electrode 50, it is possible to obtain the transistor action.

FIG. 17c is a modified example of the present embodiment. As shown in the diagram, a transistor may be formed by using the semiconductor layer 100 at the level difference 501.

Further, when a semiconductor device of three dimensional construction is formed, there will be formed in its periphery the Si portion, having an insulating layer (for example, $SiO_2$) on one side, parasitically. The embodiment shown in FIG. 17c is intended to utilize the level difference portion 501, consisting of the insulating layer, in the parasitic construction.

EMBODIMENT 14

Figure 18A:
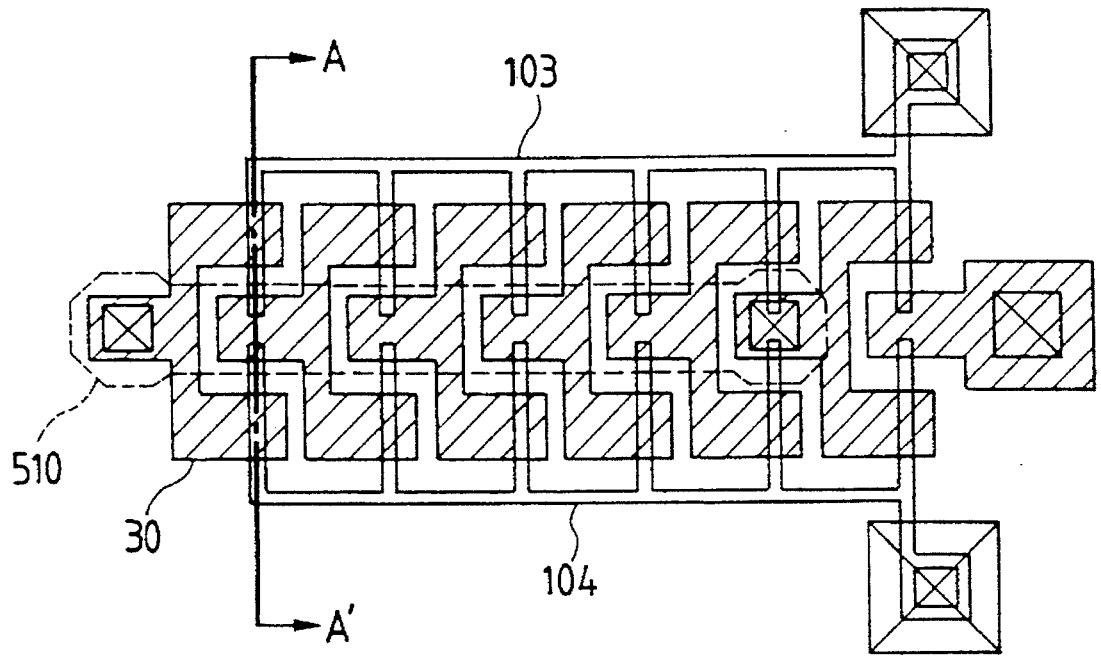
FIG. 18a is a plan view of the semiconductor device in an embodiment of the present invention.
Figure 18B:
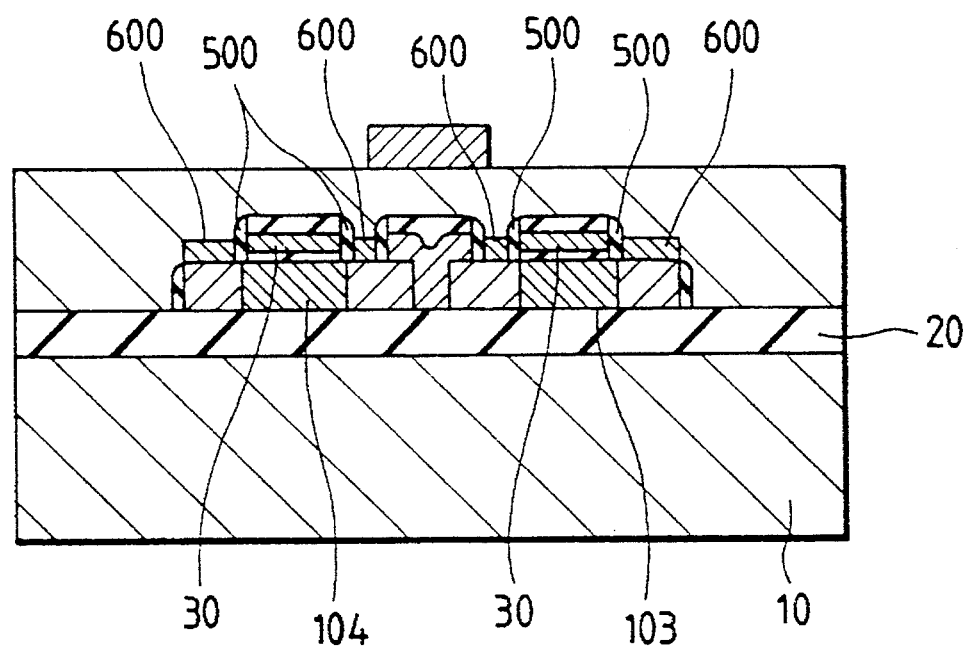

FIGS. 18a and 18b show a case where CMOS inverter chain of 5 stages has been formed by using the transistor of the construction under the present invention. FIG. 18a is a plan layout, and FIG. 18b an A–A' section of FIG. 18a. The thin film semiconductor layer 103 of comb shape constitutes NMOS, and the thin film semiconductor layer 104 constitutes PMOS. Further, in the present embodiment, it is possible to increase conductivity of the thin film semiconductor layer, by providing the silicide layer 600, on the thin silicon film surface, produced from the reaction between thin film surface of silicon and a metal, for example, tungsten, after the spacer 500 of silicon oxide is formed on the side wall of the gate 30. In the diffusion layer constituting the conventional source and drain, due to resistance and the parasitic capacity with respect to the substrate, it was difficult for use as the wiring layer. However, in the present embodiment, it can be used as the wiring layer in the first layer. Further, since each element is independent, it is possible to easily maintain isolation between elements, even if integrated. In FIG. 18a, numeral 510 denotes the input hole.

EMBODIMENT 15

Figure 19A:
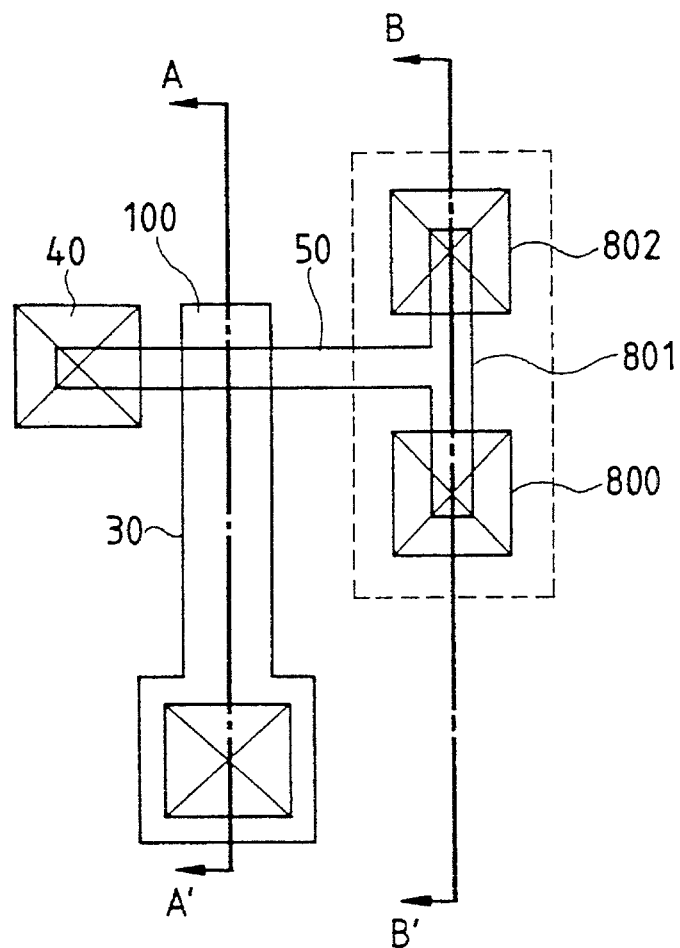
FIG. 19a is a plan layout diagram of the semiconductor device in an embodiment of the present invention.
Figure 19B:
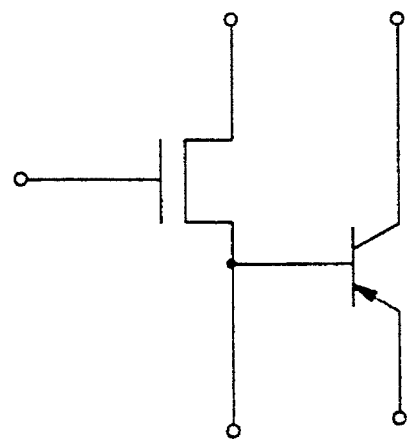
Figure 20A:
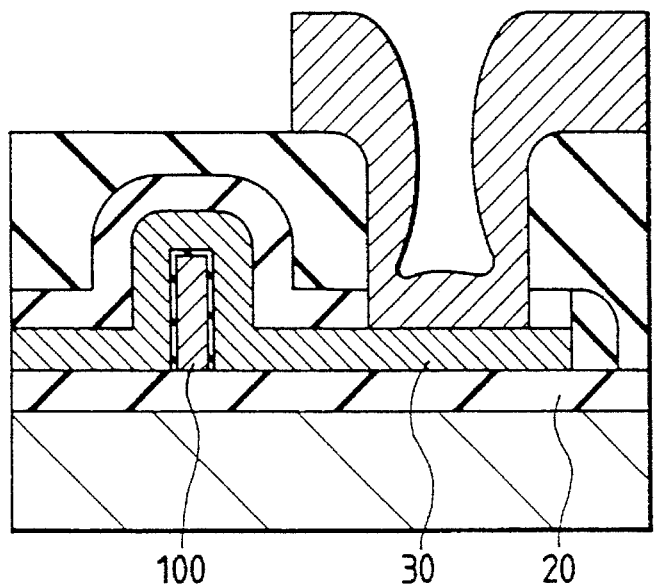
Figure 20B:
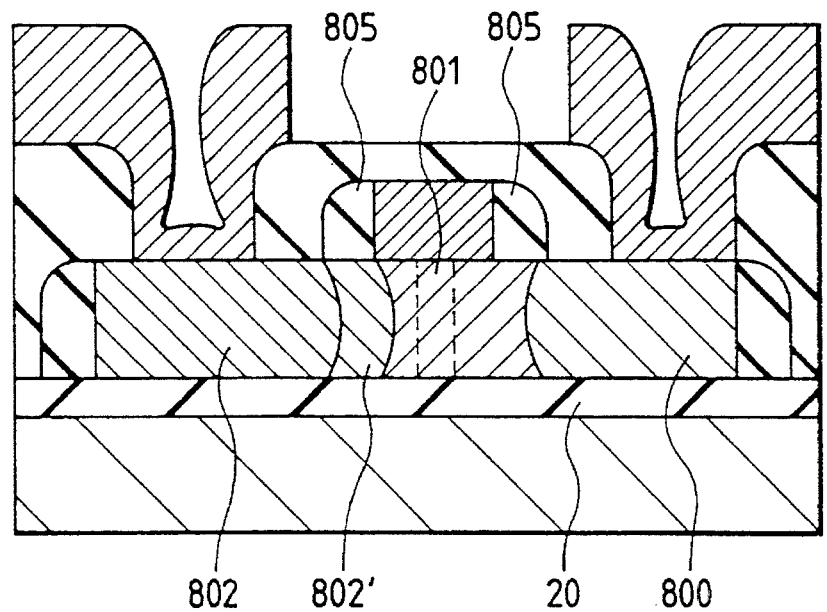

Further, it is possible to produce a bipolar transistor by using the semiconductor layer 100. Since it can be formed in the same manner as MOSFET, a circuit jointly having both MOSFET and bipolar transistor can be easily formed. FIG. 19a is a plan layout of one example thereof, and FIG. 19b shows an equivalent circuit diagram. An A–A' section of MOS portion in FIG. 19a is shown in FIG. 20a, and a B–B' section of bipolar transistor portion in FIG. 19a is shown in FIG. 20b. As to the bipolar transistor, its mask can be formed on the base 801 with silicon oxide at the time of MOS gate processing, thereby forming the emitter 800 and the collector 802 regions by the ion implantation method. At this time, it is possible to form the spacer 805 on the mask side wall and to have the two stages of the impurity concentration distribution only on one side by two ion implantations; one each before and after thereof. By such process, it is possible to form the medium concentration region 802'.

EMBODIMENT 16

Similarly, a plan layout of another semiconductor device, forming a circuit jointly having both bipolar transistor and MOSFET, is shown in FIG. 21a, and its equivalent circuit in FIG. 21b. It is possible to form this device in the similar manner as the example shown in FIGS. 19a and 19b.

EMBODIMENT 17

An example of forming DRAM cell having two transistors, using transistors of the construction under the present invention, is shown in FIGS. 24a through 24c. FIG. 24a is an equivalent circuit diagram, FIG. 24b a sectional view of an element, and FIG. 24c an A–A' section of FIG. 24b, where a sectional construction in a direction which intersects with FIG. 24b at a right angle is shown. A selective transistor α and a memory transistor β are formed on the semiconductor layer 100. Transistor β will have the channel 910 formed, by having the semiconductor layer 100 as the gate electrode 32 on the rear side, and by depositing polycrystalline silicon thereon for around 500 Å with CVD method, after the gate oxidation, and, further, will have the upper gate electrode 30 formed after forming the gate oxide film 91. In the channel 910, Vth (threshold voltage) of the gate electrode 30 will change by the electric potential of gate electrode 32 on the rear side, namely, the electric charge stored in gate electrode 32. In reading this change it is possible to have the cell work as memory element.

EMBODIMENT 18

Figure 25A:
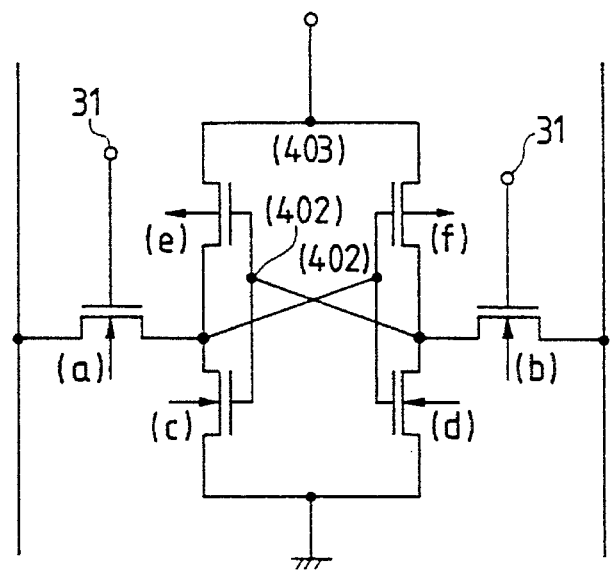
FIG. 25a is an equivalent circuit diagram of the semiconductor memory device in an embodiment of the present invention.

FIG. 25*a* is the memory cell equivalent circuit diagram of SRAM (static random-access memory). Here, PMOS and NMOS are indicated by using symbols of the substrate. since the substrate is separated in the transistor of the construction under the present invention, transistors can be arranged close together, because separation between transistors is easy. Therefore, the present transistors are effective in the case where high degree of integration is necessary, as in SRAM structure.

Figure 25B:
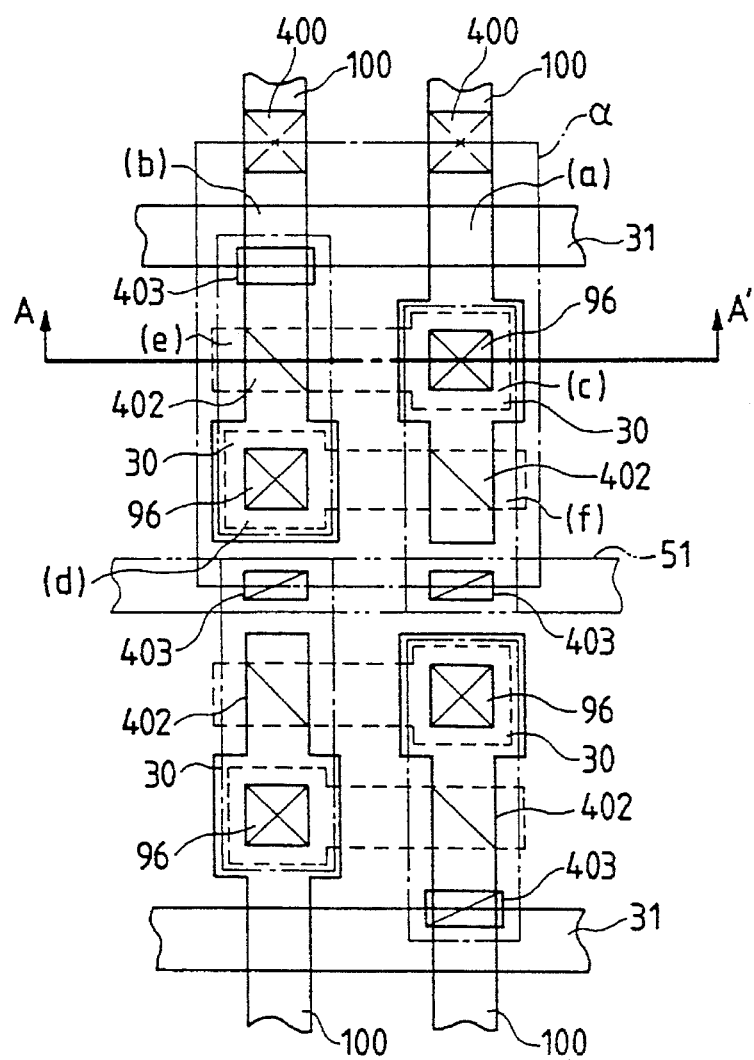
Figure 25C:
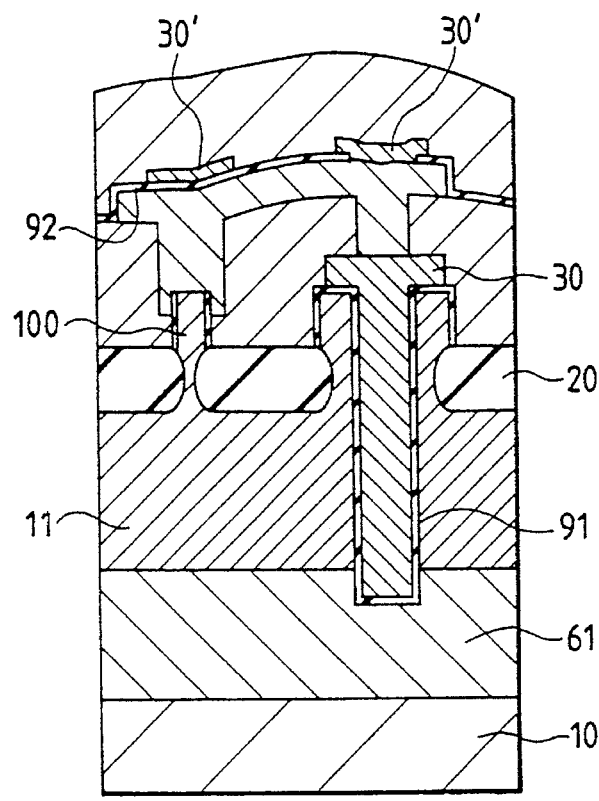

An example of actual element construction is shown in FIGS. 25*b* and 25*c*. FIG. 25*b* is a plan layout, and FIG. 25*c* is an A–A' section of FIG. 25*b*.

The frame indicated by "α" in FIG. 25*b* constitutes the memory cell of 1 bit, and FIG. 25*b* shows an example of 2 bit cell layout. In FIGS. 25*a* and 25*b*, transistors (a) and (b) having word line 31 as the gate are formed by using the semiconductor layer 100. Transistors (c) and (d) are formed of the vertical transistors by the buried-in n$^+$ layer 61 inside the substrate employing the trench 96 and by the gate 30. The gate 30 and the semiconductor 100 are connected through the contact 402. Transistors (e) and (f) are formed of polycrystalline silicon MOS transistors, having polycrystalline silicon 30' stacked on the gate 30 as the channel. This channel layer 30' is controlled by the gate 30 layer via gate insulating film 92 deposited on gate 30. Polycrystalline silicon layer 30' contacts with the gate 30, which respectively becomes a pair on the trench 96 pattern, and has the other end connected to the power source line 51 via the contact 403.

EMBODIMENT 19

Figure 26:
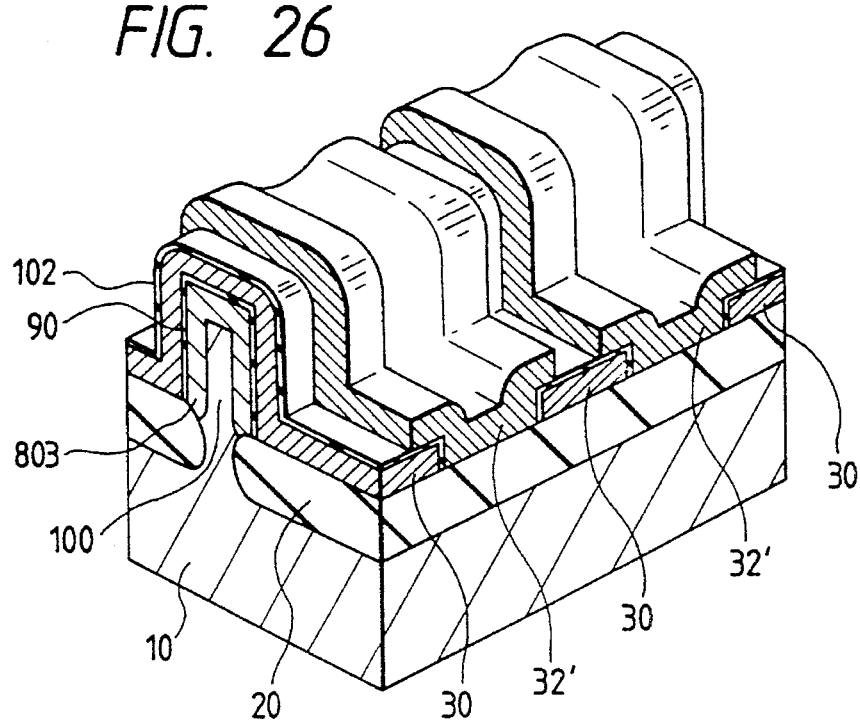
FIG. 26 is a perspective view of the charge coupled device in an embodiment of the present invention.

In the construction under the present invention, as shown in FIG. 26, it is possible to produce CCD (Charge coupled device) by stacking gates. N type medium concentration impurity layer 803 of $1\times10^{17}$ cm$^{-3}$ is formed around P type semiconductor layer 100 of $1\times10^{16}$ cm$^{-3}$ in concentration, on which the gate insulating film 90 is formed, and the gate electrode 30 is formed thereon. The silicon oxide film layer 102 is formed by selective oxidation of the upper side of gate electrode 30, without oxidizing the gate insulating film 90, on which gate electrode 32' is formed, so as to overlap with the gate electrode 30. It is possible to transfer electric charge through the semiconductor layer 100 by applying bias to the gate electrode in order.

In each of the above drawings, the identical numerals refer to the same portions substantially.

According to the present invention, it is possible to obtain a semiconductor device of high integration, provided with thin film transistors having excellent electric characteristics. Further, in using the present thin film transistor, it is possible to obtain a semiconductor memory device having excellent electric characteristics.

What is claimed is:

1. A method of manufacturing an insulated gate field effect transistor comprising:

a first step of growing a first silicon oxide film on a silicon substrate and depositing a first silicon nitride film thereon;

a second step of etching said first silicon nitride film, said first silicon oxide film and said silicon substrate by employing a resist pattern as a mask to form a silicon island comprised of a part of said silicon substrate, leaving a remaining part of the silicon substrate;

a third step of growing a second silicon oxide film on a surface of said silicon substrate exposed by said second step and on a surface of said silicon island, depositing a second silicon nitride film thereon, and etching said second silicon nitride film so as to leave a portion of said second silicon nitride film deposited on a side wall of said silicon island;

a fourth step of growing a third silicon oxide film between the remaining part of the silicon substrate and the silicon island, by thermal oxidation of the surface of said silicon substrate, to thereby form a silicon oxide layer between the remaining part of the silicon substrate and the silicon island, to separate electrically said silicon island from said remaining part of the silicon substrate; and a fifth step of forming a gate electrode on said silicon island, said gate electrode being formed on upper and side surfaces of the silicon island, and forming a source region and a drain region in said silicon island by employing said gate electrode as a mask.

2. A method of manufacturing a semiconductor memory device comprising:

a first step of growing a first silicon oxide film on a silicon substrate and depositing a first silicon nitride film thereon;

a second step of etching said first silicon nitride film, said first silicon oxide film and said silicon substrate by employing a resist pattern as a mask to form a silicon island comprised of a part of said silicon substrate, leaving a remaining part of the silicon substrate;

a third step of growing a second silicon oxide film on a surface of said silicon substrate exposed by said second step and on a surface of said silicon island, depositing a second silicon nitride film thereon, and etching said second silicon nitride film so as to leave a portion of said second silicon nitride film deposited on a side wall of said silicon island;

a fourth step of growing a third silicon oxide film between the remaining part of the silicon substrate and the silicon island, by thermal oxidation of the surface of said silicon substrate, to thereby grow a silicon oxide layer between the remaining part of the silicon substrate and the silicon island, to separate electrically said silicon island from said remaining part of the silicon substrate;

a fifth step of forming a gate electrode on said silicon island, said gate electrode being formed on upper and side surfaces of the silicon island, and forming a source region and a drain region in said silicon island by employing said gate electrode as a mask; and a sixth step of forming a plate electrode on said source region through an insulating film.

3. A method of manufacturing a semiconductor memory device according to claim 2, wherein said silicon island is formed into a T-shape.

4. A method of manufacturing an insulated gate field effect transistor comprising:

a first step of growing a first silicon oxide film on a silicon substrate and depositing a first silicon nitride film thereon;

a second step of etching said first silicon nitride film, said first oxide film and said silicon substrate by employing a resist pattern as a mask to form a silicon island comprised of a part of said silicon substrate, leaving a remaining part of the silicon substrate;

a third step of growing a second silicon oxide film on a surface of said silicon substrate exposed by said second step and on a surface of said silicon island, depositing a second silicon nitride film thereon, and etching said second silicon nitride film so as to leave a portion of said second silicon nitride film deposited on a side wall of said silicon island; and a fourth step of forming a gate electrode of the transistor on said silicon island, said gate electrode being formed on upper and side surfaces of the silicon island at which said transistor is formed, and forming a source region and a drain region in said silicon island by employing said gate electrode as a mask.

5. A method of manufacturing a semiconductor memory device comprising:

a first step of growing a first silicon oxide film on a silicon substrate and depositing a first silicon nitride film thereon;

a second step of etching said first silicon nitride film, said first silicon oxide film and said silicon substrate by employing a resist pattern as a mask to form a silicon island comprised of a part of said silicon substrate, leaving a remaining part of the silicon substrate;

a third step of growing a second silicon oxide film on a surface of said silicon substrate exposed by said second step and on a surface of said silicon island, depositing a second silicon nitride film thereon, and etching said second silicon nitride film so as to leave a portion of said second silicon nitride film deposited on a side wall of said silicon island;

a fourth step of forming a gate electrode of a transistor on said silicon island, said gate electrode being formed on upper and side surfaces of the silicon island at which said transistor is formed, and forming a source region and a drain region in said silicon island by employing said gate electrode as a mask; and a fifth step of forming a plate electrode on said source region with an insulating film interposed between the plate electrode and the source region.

6. A method of manufacturing a semiconductor memory device according to claim 5, wherein said silicon island is formed into a T-shape.

7. A method of manufacturing a semiconductor memory device according to claim 5, wherein the silicon substrate is etched, during the second step of etching, to a first depth, and wherein the resist pattern has a width of less than the first depth.

8. A method of manufacturing an insulated gate field effect transistor according to claim 4, wherein the silicon substrate is etched, during the second step of etching, to a first depth, and wherein the resist pattern has a width of less than the first depth.

9. A method of manufacturing a semiconductor memory device according to claim 5, including a further step, after the third step, of growing a third silicon oxide film between the remaining part of the silicon substrate and the silicon island, to thereby form a silicon oxide layer between the remaining part of the silicon substrate and the silicon island.

10. A method of manufacturing a semiconductor memory device according to claim 9, wherein the third silicon oxide film is grown so as to completely separate the remaining part of the silicon substrate from the silicon island, thereby to separate electrically the silicon island from the remaining part of the silicon substrate.

11. A method of manufacturing a semiconductor memory device according to claim 9, wherein the third silicon oxide film is grown by thermal oxidation of the silicon substrate, while the portion of the second silicon nitride film is on the side wall of the silicon island.

12. A method of manufacturing an insulated gate field effect transistor according to claim 4, including a further step, after the third step, of growing a third silicon oxide film between the remaining part of the silicon substrate and the silicon island, to thereby form a silicon oxide layer between the remaining part of the silicon substrate and the silicon island.

13. A method of manufacturing an insulated gate field effect transistor according to claim 12, wherein the third silicon oxide film is grown so as to completely separate the remaining part of the silicon substrate from the silicon island, thereby to separate electrically the silicon island from the remaining part of the silicon substrate.

14. A method of manufacturing an insulated gate field effect transistor according to claim 12, wherein the third silicon oxide film is grown by thermal oxidation of the silicon substrate, while the portion of the second silicon nitride film is on the side wall of the silicon island.

15. A method of manufacturing an insulated gate field effect transistor according to claim 1, wherein the silicon island is formed to have a first height at a central portion thereof and a second height at end portions thereof, the first height being greater than the second height.

16. A method of manufacturing a semiconductor device, comprising the steps of:

(a) providing a silicon substrate having projections of silicon extending from a surface thereof, a remaining portion of the silicon substrate not having the projections extending from the surface thereof, the projections respectively forming silicon islands;

(b) after step (a), forming a silicon oxide film between the silicon islands, on the remaining portion of the silicon substrate, the silicon oxide film extending beneath the silicon islands;

(c) forming gate electrodes on said silicon islands, said gate electrodes being formed on upper and side surfaces of the silicon islands, the gate electrodes being gate electrodes of transistors; and (d) forming impurity-doped semiconductor regions of the semiconductor device in the silicon islands by employing said gate electrodes as masks, the semiconductor regions being regions of semiconductor elements of the semiconductor device.

17. A method of manufacturing a semiconductor device according to claim 16, wherein the surface of the silicon substrate is thermally oxidized so as to form the silicon oxide film between the silicon islands, on the remaining portion of the silicon substrate, and extending beneath the silicon islands.

18. A method of manufacturing a semiconductor device according to claim 16, wherein the silicon oxide film is formed to extend on the remaining portion of the silicon substrate and beneath the silicon islands, so as to substantially completely separate electrically the silicon island from the silicon substrate.

19. A method of manufacturing a semiconductor device according to claim 16, wherein during the forming of the silicon oxide film, a silicon nitride film is on side walls of the silicon islands; and wherein the silicon oxide film is formed by thermal oxidation of the silicon substrate, the silicon nitride film acting to mask the side walls of the silicon islands from being oxidized.

20. A method of manufacturing a semiconductor device according to claim 16, wherein the projections are formed from the silicon substrate by etching the substrate.

* * * * *